United States Patent
Lee et al.

(10) Patent No.: US 12,446,418 B2
(45) Date of Patent: Oct. 14, 2025

(54) DISPLAY PANEL AND METHOD FOR MANUFACTURING THE SAME

(71) Applicant: Samsung Display Co., Ltd., Yongin-si (KR)

(72) Inventors: Kyunghoe Lee, Hwaseong-si (KR); Ji-Sun Kim, Seoul (KR); Youngwan Seo, Suwon-si (KR); Keunhee Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 668 days.

(21) Appl. No.: 17/828,641

(22) Filed: May 31, 2022

(65) Prior Publication Data

US 2023/0080818 A1 Mar. 16, 2023

(30) Foreign Application Priority Data

Sep. 15, 2021 (KR) ........................ 10-2021-0123209

(51) Int. Cl.
*H10K 59/131* (2023.01)
*H10K 59/12* (2023.01)
*H10K 59/123* (2023.01)

(52) U.S. Cl.
CPC ....... *H10K 59/131* (2023.02); *H10K 59/1201* (2023.02); *H10K 59/123* (2023.02)

(58) Field of Classification Search
CPC .... H10K 59/121; H10K 59/131; H10K 59/40; H10K 59/123; H10K 59/1201; H10K 59/879; H10K 59/38; H10K 59/122; H10K 50/858; H10K 59/12; H10K 59/8792; H10K 59/8722; H10K 50/84; H10K 59/126; H10K 59/353; H10K 59/352; H10K 59/8731; H10K 59/65; H10K 59/60; H10K 59/88;
(Continued)

(56) References Cited

U.S. PATENT DOCUMENTS 8,599,355 B2  12/2013 Oh et al.
9,111,890 B2  8/2015 Chung et al.
(Continued)

FOREIGN PATENT DOCUMENTS

KR   10-1275810 B1   6/2013
KR   10-1284287      7/2013
(Continued)

*Primary Examiner* — Mouloucoulaye Inoussa
(74) *Attorney, Agent, or Firm* — Sughrue Mion, PLLC

(57) ABSTRACT

A display panel includes a circuit layer including first, second, and third intermediate insulating layers, first and second conductive patterns, and a light emitting element layer disposed on the circuit layer, and including first and second light emitting elements in a first area and a second area of a base layer. The first light emitting element is electrically connected to one of the first conductive patterns through a first through-hole formed through the second intermediate insulating layer and the third intermediate insulating layer. The second light emitting element is electrically connected to one of the second conductive patterns through a second through-hole formed through the third intermediate insulating layer. A smallest width of the first through-hole and a smallest width of the second through-hole are substantially equal in a cross-section.

19 Claims, 14 Drawing Sheets

(58) Field of Classification Search
CPC ............... H10K 77/10; H10K 77/111; H10K 2102/3023; G09G 3/2003; G09G 3/3233; G09G 3/3225; G09G 2300/0452; G09G 2300/0819; G09G 2300/0861; G09G 2320/0238; G09G 2300/0842; G09G 2320/0686; G02F 1/1345; G02F 1/13452; G06V 40/19; H04N 23/57; G06F 3/0416; G06F 3/0412; H04M 1/0266; Y02E 10/549

See application file for complete search history.

(56) References Cited

U.S. PATENT DOCUMENTS

| | | | |
|---|---|---|---|
| 10,985,189 B2 | 4/2021 | Kim et al. | |
| 11,631,370 B2* | 4/2023 | Im | G09G 3/3208 345/214 |
| 11,723,238 B2 | 8/2023 | Kim et al. | |
| 2019/0012031 A1* | 1/2019 | Kim | H10K 77/111 |
| 2020/0091252 A1* | 3/2020 | Bang | H10K 50/82 |
| 2020/0091256 A1* | 3/2020 | Kim | H10K 77/111 |
| 2020/0119115 A1* | 4/2020 | Moon | H10K 59/127 |
| 2020/0185467 A1* | 6/2020 | Sun | H10K 59/121 |
| 2020/0350393 A1* | 11/2020 | Lhee | H10K 50/844 |
| 2020/0381653 A1* | 12/2020 | Bang | H10K 50/844 |
| 2021/0066433 A1* | 3/2021 | Cha | H10K 59/131 |
| 2021/0098539 A1* | 4/2021 | Zhang | H10K 59/131 |
| 2021/0126078 A1* | 4/2021 | Lee | G02F 1/1345 |
| 2021/0175470 A1* | 6/2021 | Kang | H10K 77/111 |
| 2021/0183983 A1* | 6/2021 | Bang | H10K 59/121 |
| 2021/0193749 A1* | 6/2021 | Kim | H10K 59/65 |
| 2021/0202683 A1* | 7/2021 | Lee | H10K 59/131 |
| 2021/0210020 A1* | 7/2021 | Cho | G09G 3/3266 |
| 2021/0210563 A1* | 7/2021 | Huang | G09G 3/3208 |
| 2021/0241671 A1* | 8/2021 | Lee | G09G 3/2003 |
| 2021/0249482 A1* | 8/2021 | Lee | H10K 59/353 |
| 2021/0265579 A1* | 8/2021 | Lee | H10K 59/131 |
| 2021/0296366 A1* | 9/2021 | Kim | H01L 27/1218 |
| 2021/0320163 A1* | 10/2021 | Bang | H10K 59/131 |
| 2021/0376006 A1* | 12/2021 | Won | H10K 59/121 |
| 2021/0408475 A1* | 12/2021 | Moon | H10K 59/131 |
| 2022/0045151 A1* | 2/2022 | Jeong | H01L 27/1255 |
| 2022/0069048 A1* | 3/2022 | Bok | H10K 59/121 |
| 2022/0093693 A1* | 3/2022 | Kim | H10K 59/131 |
| 2022/0109040 A1* | 4/2022 | Jung | G09G 3/3225 |
| 2022/0131113 A1* | 4/2022 | Jung | H10K 50/865 |
| 2022/0137742 A1* | 5/2022 | Kim | G06F 3/0443 345/174 |
| 2022/0140041 A1* | 5/2022 | Lee | H10K 59/879 257/40 |
| 2022/0208901 A1* | 6/2022 | Cha | H01K 25/0753 |
| 2022/0208918 A1* | 6/2022 | Cho | H10K 59/123 |
| 2022/0285456 A1* | 9/2022 | Hong | H10K 59/1213 |
| 2022/0285475 A1* | 9/2022 | Hong | H10K 59/122 |
| 2023/0055898 A1* | 2/2023 | Kim | H10K 71/00 |

FOREIGN PATENT DOCUMENTS

| | | |
|---|---|---|
| KR | 10-2052434 | 12/2019 |
| KR | 10-2021-0010716 A | 1/2021 |
| KR | 10-2017-0062647 A | 10/2023 |

* cited by examiner

DISPLAY PANEL AND METHOD FOR MANUFACTURING THE SAME

CROSS-REFERENCE TO RELATED APPLICATION(S)

This application claims priority to and benefits of Korean Patent Application No. 10-2021-0123209 under 35 U.S.C. § 119 filed on Sep. 15, 2021, in the Korean Intellectual Property Office, the entire contents of which are incorporated herein by reference.

BACKGROUND

1. Technical Field

Embodiments described herein relate to a display panel and a method for manufacturing the same, and, to a display panel having a decreased bezel and a method for manufacturing display panel having a decreased bezel.

2. Description of the Related Art

Multimedia electronic devices, such as a television, a mobile phone, a tablet computer, a computer, a navigation system, a game machine, and the like, include a display panel for displaying an image.

Nowadays, to meet market demand, research is being conducted to reduce an area in which an image is not displayed on a display panel. At the same time, research is being conducted to expand a display area in which an image is displayed on a display panel and to reduce a bezel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display panel having a decreased bezel and a method for manufacturing a display panel having a decreased bezel.

According to an embodiment, a display panel may include a base layer including a first area; a second area; and a third area, the third area being disposed between the first area and the second area; a circuit layer including a first intermediate insulating layer disposed on the base layer; first conductive patterns disposed on the first intermediate insulating layer; a second intermediate insulating layer covering the first conductive patterns; second conductive patterns disposed on the second intermediate insulating layer; and a third intermediate insulating layer covering the second conductive patterns; and a light emitting element layer disposed on the circuit layer, the light emitting element layer including a first light emitting element and a second light emitting element disposed in the first area and the second area, respectively, of the base layer. The first light emitting element is electrically connected to one of the first conductive patterns through a first through-hole formed through the second intermediate insulating layer and the third intermediate insulating layer. The second light emitting element is electrically connected to one of the second conductive patterns through a second through-hole formed through the third intermediate insulating layer. A smallest width of the first through-hole and a smallest width of the second through-hole are substantially equal to each other on a cross-section.

In an embodiment, the first conductive patterns may be spaced apart from each other and disposed in the first area and the third area of the base layer.

In an embodiment, the second conductive patterns may be spaced apart from and disposed in the second area and the third area.

In an embodiment, the circuit layer may include a first pixel transistor disposed in the first area and a second pixel transistor disposed in the third area of the base layer.

In an embodiment, the circuit layer may include a drive transistor disposed in the second area of the base layer.

In an embodiment, one of the first conductive patterns may electrically connect the first light emitting element to the first pixel transistor.

In an embodiment, one of the second conductive patterns may electrically connect the second light emitting element to the second pixel transistor.

In an embodiment, the first pixel transistor and the second pixel transistor may be disposed below the first intermediate insulating layer.

In an embodiment, the second conductive patterns may contain a transparent conductive oxide.

In an embodiment, the light emitting element layer may include a third light emitting element disposed in the third area of the base layer, and the circuit layer may include a third pixel transistor electrically connected to the third light emitting element and disposed in the third area of the base layer.

In an embodiment, one of the second conductive patterns may electrically connect the third light emitting element to the third pixel transistor.

According to an embodiment, a display panel may include a base layer including a first area and a second area spaced apart from each other on a plane; a circuit layer including insulating layers including a first through-hole and a second through-hole; a first conductive pattern disposed between two insulating layers among the insulating layers and disposed in the first area of the base layer; and a second conductive pattern disposed between two insulating layers among the insulating layers and disposed in the second area of the base layer, the second conductive pattern overlapping the first conductive pattern in a plan view; and a light emitting element layer including a first light emitting element and a second light emitting element disposed in the first area and the second area, respectively, of the base layer. The first through-hole exposes a first surface of an upper surface of the first conductive pattern, and the second through-hole exposes a second surface of an upper surface of the second conductive pattern. The first light emitting element contacts the first surface, and the second light emitting element contacts the second surface. The second surface and the first surface have a same shape.

In an embodiment, the circuit layer may include a first pixel transistor disposed in the first area and a second pixel transistor disposed in the second area of the base layer.

In an embodiment, the first conductive pattern may electrically connect the first light emitting element to the first pixel transistor, and the second conductive pattern may electrically connect the second light emitting element to the second pixel transistor.

According to an embodiment, a method for manufacturing a display panel may include preparing a mask including a first opening and a second opening smaller than the first opening, the first opening being spaced apart from the second opening; preparing an initial substrate including pixel transistors disposed in a first area; a driver circuit including a drive transistor disposed in a second area spaced apart from the pixel transistors; a first intermediate insulating layer disposed on the driver circuit and the pixel transistors; a first conductive pattern overlapping the first area and disposed on the first intermediate insulating layer in a plan view, a second intermediate insulating layer covering the first conductive pattern; a second conductive pattern overlapping the second area and disposed on the second intermediate insulating layer in a plan view; and a third intermediate insulating layer covering the second conductive pattern; aligning the mask with the initial substrate such that the first opening overlaps the first conductive pattern and the second opening overlaps the second conductive pattern in a plan view; and forming a first through-hole and a second through-hole in the initial substrate using the mask, wherein the first through-hole corresponds to the first opening and penetrates the second intermediate insulating layer and the third intermediate insulating layer, the second through-hole corresponds to the second opening and penetrates the third intermediate insulating layer. The first through-hole exposes a first surface of an upper surface of the first conductive pattern, the second through-hole exposes a second surface of an upper surface of the second conductive pattern, and the second surface and the first surface have substantially a same shape in a plan view.

In an embodiment, the first opening, the first surface, and the second surface may have substantially a same shape in a plan view.

In an embodiment, the mask may include a first portion including the first opening and a second portion including the second opening. In the aligning of the mask with the initial substrate, the first portion may overlap the first area, and the second portion may overlap the second area in a plan view.

In an embodiment, the initial substrate may include a third area disposed between the first area and the second area, and the third area may include pixel transistors.

In an embodiment, the method may further include forming a light emitting element layer on the third intermediate insulating layer after the forming of the first through-hole and the second through-hole in the initial substrate using the mask. A first light emitting element disposed in the first area and electrically connected to the first conductive pattern through the first through-hole and a second light emitting element disposed in the second area and electrically connected to the second conductive pattern through the second through-hole may be formed in the forming of the light emitting element layer on the third intermediate insulating layer.

In an embodiment, the first light emitting element may be electrically connected to one of the pixel transistors disposed in the first area through the first conductive pattern, and the second light emitting element may be electrically connected to one of the pixel transistors disposed in the third area through the second conductive pattern.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1:
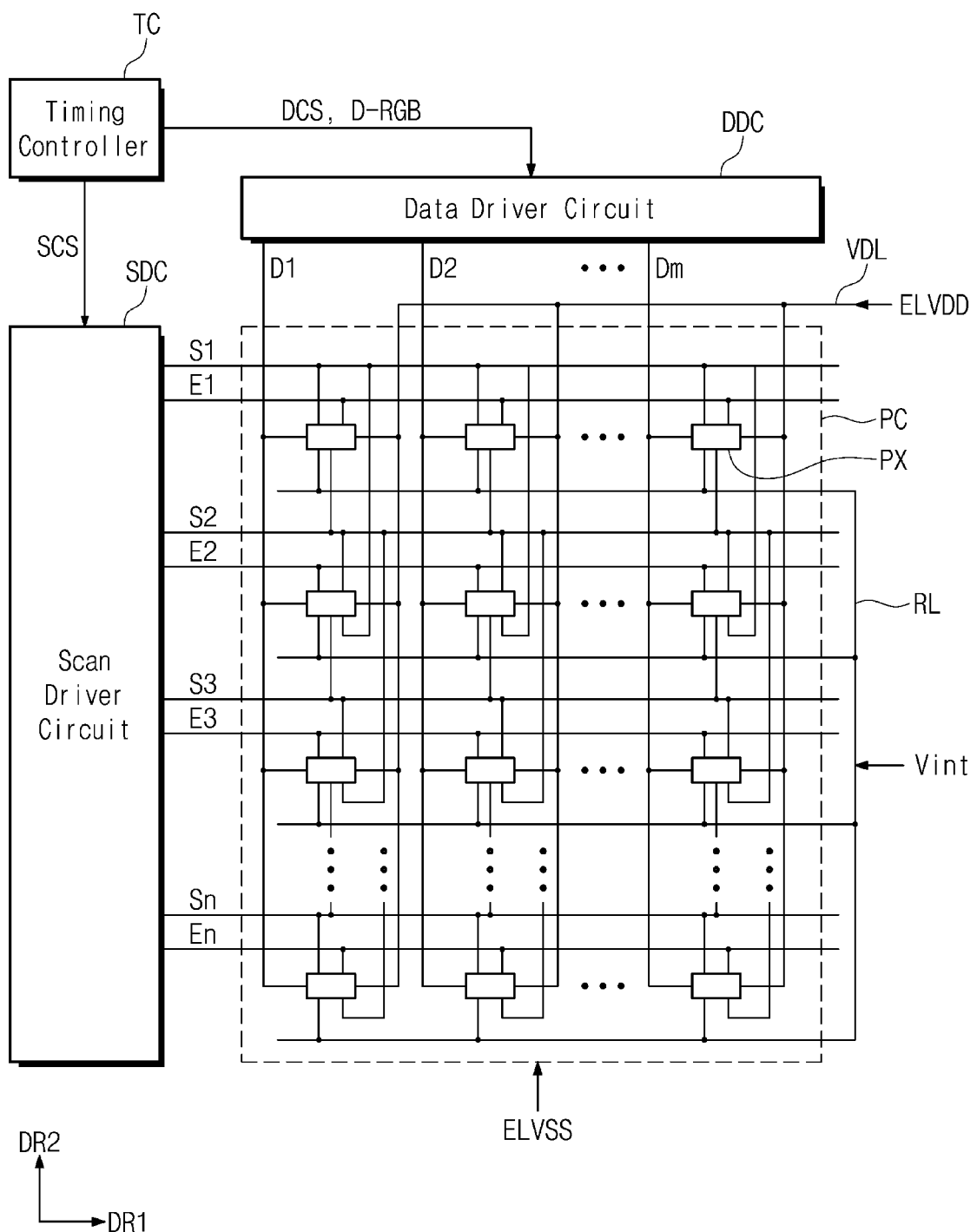
FIG. 1 is a block diagram of an electronic device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

It will be understood that the terms "connected to" or "coupled to" may include a physical or electrical connection or coupling.

Identical reference numerals refer to identical components. In the drawings, the thicknesses, proportions, and dimensions of components may be exaggerated for effective description.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms such as first, second, and the like may be used to describe various components, but the components should not be limited by the terms. The terms may be used only for distinguishing one component from other components. For example, without departing from the scope of the disclosure, a first component may be referred to as a second component, and similarly, the second component may also be referred to as the first component.

The terms of a singular form may include plural forms unless otherwise specified. For example, as used herein, the singular forms, "a," "an," and "the" are intended to include the plural forms as well, unless the context clearly indicates otherwise.

Terms such as "below", "under", "above", and "over" are used to describe a relationship of components illustrated in the drawings. The terms are relative concepts and are described based on directions illustrated in the drawing but are not limited thereto.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise implied or defined, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the specification.

It should be understood that terms such as "comprise", "include", and "have", and variations thereof when used in this specification, specify the presence of stated features, numbers, steps, operations, components, parts, or combinations thereof, but do not preclude the presence or addition of one or more other features, numbers, steps, operations, components, parts, or combinations thereof.

Hereinafter, embodiments will be described with reference to the accompanying drawings.

FIG. 1 is a block diagram of an electronic device according to an embodiment. A display device according to the disclosure may be a semiconductor device including at least one semiconductor. The electronic device may include a timing controller TC, a scan driver circuit SDC, a data driver circuit DDC, and a display panel 100. The display panel 100 may display an image depending on an electrical signal.

In this embodiment, as an example, the display panel 100 is an organic light emitting display panel. This is illustrative, and the display panel 100 according to the disclosure may include various embodiments, such as a quantum-dot light emitting display panel, an inorganic light emitting display panel, and the like within the spirit and the scope of the disclosure.

The timing controller TC may receive input image signals (not illustrated) and may generate image data D-RGB by converting the data format of the input image signals according to the specification of an interface with the scan driver circuit SDC. The timing controller TC may output the image data D-RGB and various control signals DCS and SCS.

The scan driver circuit SDC may receive the scan control signal SCS from the timing controller TC. The scan control signal SCS may include a vertical start signal to start operation of the scan driver circuit SDC and a clock signal to determine the time to output signals.

The scan driver circuit SDC may generate scan signals and may sequentially output the scan signals to scan lines SL1 to SLn (S1, S2, S3, Sn). Furthermore, the scan driver circuit SDC may generate emission control signals in response to the scan control signal SCS and may output the emission control signals to emission lines E1, E2, E3 . . . En.

Although FIG. 1 illustrates an example that the scan signals and the emission control signals are output from the one scan driver circuit SDC, the disclosure is not limited thereto. In an embodiment, scan driver circuits may separately output scan signals and may separately output emission control signals. Furthermore, in an embodiment, a driver circuit that generates and outputs scan signals and a driver circuit that generates and outputs emission control signals may be separately divided from each other.

The data driver circuit DDC may receive the data control signal DCS and the image data D-RGB from the timing controller TC. The data driver circuit DDC may convert the image data D-RGB into data signals and may output the data signals to data lines D1, D2 . . . Dm. The data signals may be analog voltages corresponding to gray level values of the image data D-RGB.

The display panel 100 may include the scan lines SL1 to SLn, the emission lines E1, E2, E3 . . . En, the data lines D1, D2 . . . Dm, and pixels PX. The scan lines SL1 to SLn may extend in a first direction DR1 and may be arranged or disposed in a second direction DR2 crossing or intersecting the first direction DR1.

Each of the emission lines E1, E2, E3 . . . En may be arranged or disposed parallel to a corresponding one of the scan lines SL1 to SLn. The data lines D1, D2 . . . Dm may insulatively cross the scan lines SL1 to SLn.

Each of the pixels PX may be connected to a corresponding one of the scan lines SL1 to SLn, a corresponding one of the emission lines E1, E2, E3 . . . En, and a corresponding one of the data lines D1, D2 . . . Dm.

Each of the pixels PX may receive a first power voltage ELVDD and a second power voltage ELVSS having a lower level than the first power voltage ELVDD. Each of the pixels PX may be connected to a drive power line VDL to which the first power voltage ELVDD is applied. Each of the pixels PX may be connected to an initialization line RL that receives an initialization voltage Vint.

Each of the pixels PX may be electrically connected to three scan lines. As illustrated in FIG. 1, pixels in the second pixel row may be connected to the first to third scan lines SL1 to SL3.

The display panel 100 may further include dummy scan lines. The display panel 100 may further include a dummy scan line connected to pixels PX in the first pixel row and a dummy scan line connected to pixels PX in the nth pixel row. Furthermore, pixels connected to one data line among the data lines D1, D2 . . . Dm (hereinafter, referred to as the pixels in the pixel column) may be connected together. Two pixels adjacent to each other among the pixels in the pixel column may be electrically connected with each other. However, this is illustrative, and a connection relationship between the pixels PX according to an embodiment may be designed in various ways and is not limited to any one embodiment.

Each of the pixels PX may include an organic light emitting diode (not illustrated) and a pixel driver circuit (not illustrated) that controls emission of the organic light emitting diode. The pixel driver circuit may include a thin film transistor and a capacitor.

In this embodiment, at least one of the scan driver circuit SDC or the data driver circuit DDC may include thin film transistors formed through a same process as the pixel driver circuit. For example, both the scan driver circuit SDC and the data driver circuit DDC may be mounted on the display panel 100. By way of example, one of the scan driver circuit SDC or the data driver circuit DDC may be mounted on the display panel 100, and the other may be provided as a separate circuit board independent of the display panel 100 and may be connected to the display panel 100.

Figure 2:
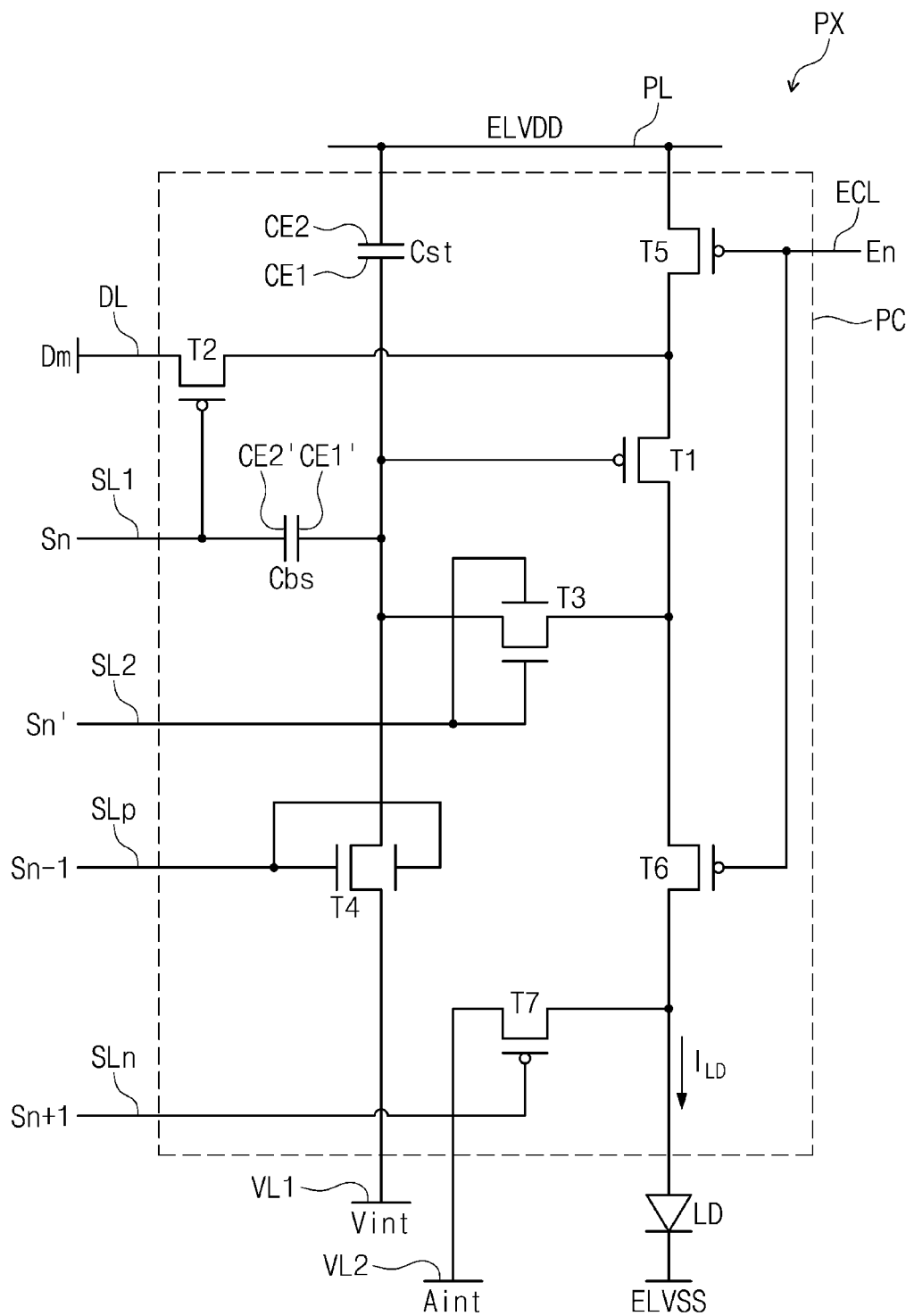
FIG. 2 is a schematic diagram of an equivalent circuit of a pixel according to an embodiment.

FIG. 2 is a schematic diagram of an equivalent circuit of a pixel PX according to an embodiment.

Referring to FIG. 2, an equivalent circuit diagram of one pixel PX among the pixels PX is illustrated. The pixel PX may include a light emitting element LD and a pixel circuit PC. The light emitting element LD may be a component included in a light emitting element layer 130 of FIG. 4 that will be described below.

The pixel circuit PC may include thin film transistors T1 to T7 and a storage capacitor Cst. The thin film transistors T1 to T7 and the storage capacitor Cst may be electrically connected to signal lines SL1, SL2, SLp, SLn, ECL, and DL, a first initialization voltage line VL1, a second initialization voltage line VL2 (or, an anode initialization voltage line), and a drive voltage line PL. In an embodiment, at least one of the aforementioned lines, for example, the drive voltage line PL may be shared by adjacent pixels PX.

The thin film transistors T1 to T7 may include the drive thin film transistor T1, the switching thin film transistor T2, the compensation thin film transistor T3, the first initialization thin film transistor T4, the operation control thin film transistor T5, the emission control thin film transistor T6, and the second initialization thin film transistor T7.

The light emitting element LD may include a first electrode (for example, an anode electrode or a pixel electrode) and a second electrode (for example, a cathode electrode or a common electrode). The first electrode of the light emitting element LD may be connected to the drive thin film transistor T1 through the emission control thin film transistor T6 and may receive a drive current ILD, and the second electrode of the light emitting element LD may receive a low power voltage ELVSS. The light emitting element LD may generate light having a luminance corresponding to the drive current ILD.

Some or a number of the thin film transistors T1 to T7 may be implemented with an n-channel MOSFET (NMOS), and the rest may be implemented with a p-channel MOSFET (PMOS). For example, among the thin film transistors T1 to T7, the compensation thin film transistor T3 and the first initialization thin film transistor T4 may be implemented with an n-channel MOSFET (NMOS), and the rest may be implemented with a p-channel MOSFET (PMOS).

In an embodiment, among the thin film transistors T1 to T7, the compensation thin film transistor T3, the first initialization thin film transistor T4, and the second initialization thin film transistor T7 may be implemented with an NMOS, and the rest may be implemented with a PMOS. By way of example, only one of the thin film transistors T1 to T7 may be implemented with an NMOS, and the rest may be implemented with a PMOS. In another case, all of the thin film transistors T1 to T7 may be implemented with an NMOS or a PMOS.

The signal lines may include the first scan line SL1 that transmits a first scan signal Sn, the second scan line SL2 that transmits a second scan signal Sn', the previous scan line SLp that transmits a previous scan signal Sn−1 to the first initialization thin film transistor T4, the emission control line ECL that transmits an emission control signal En to the operation control thin film transistor T5 and the emission control thin film transistor T6, the next scan line SLn that transmits a next scan signal Sn+1 to the second initialization thin film transistor T7, and the data line DL that crosses or intersects the first scan line SL1 and transmits a data signal Dm.

The drive voltage line PL may transmit a drive voltage ELVDD to the drive thin film transistor T1, and the first initialization voltage line VL1 may transmit an initialization voltage Vint that initializes the drive thin film transistor T1 and the pixel electrode.

A drive gate electrode of the drive thin film transistor T1 may be connected with the storage capacitor Cst. A drive source area of the drive thin film transistor T1 may be connected to the drive voltage line PL through the operation control thin film transistor T5. A drive drain area of the drive thin film transistor T1 may be electrically connected with the first electrode of the light emitting element LD through the emission control thin film transistor T6. The drive thin film transistor T1 may receive the data signal Dm depending on a switching operation of the switching thin film transistor T2 and may supply the drive current ILD to the light emitting element LD.

A switching gate electrode of the switching thin film transistor T2 may be connected to the first scan line SL1 that transmits the first scan signal Sn. A switching source area of the switching thin film transistor T2 may be connected to the data line DL. A switching drain area of the switching thin film transistor T2 may be connected to the drive source area of the drive thin film transistor T1 and may be connected to the drive voltage line PL through the operation control thin film transistor T5. The switching thin film transistor T2 may be turned on depending on the first scan signal Sn transmitted through the first scan line SL1 and may perform a switching operation of transmitting the data signal Dm transmitted to the data line DL to the drive source area of the drive thin film transistor T1.

A compensation gate electrode of the compensation thin film transistor T3 may be connected to the second scan line SL2. A compensation drain area of the compensation thin film transistor T3 may be connected to the drive drain area of the drive thin film transistor T1 and may be connected with the pixel electrode of the light emitting element LD through the emission control thin film transistor T6. A compensation source area of the compensation thin film transistor T3 may be connected to a first capacitor electrode CE1 of the storage capacitor Cst and the drive gate electrode of the drive thin film transistor T1. Furthermore, the compensation source area may be connected to a first initialization drain area of the first initialization thin film transistor T4.

The compensation thin film transistor T3 may be turned on depending on the second scan signal Sn' transmitted through the second scan line SL2 and may electrically connect the drive gate electrode and the drive drain area of the drive thin film transistor T1 to diode-connect the drive thin film transistor T1.

A first initialization gate electrode of the first initialization thin film transistor T4 may be connected to the previous scan line SLp. A first initialization source area of the first initialization thin film transistor T4 may be connected to a second initialization source area of the second initialization thin film transistor T7 and the first initialization voltage line VL1. The first initialization drain area of the first initialization thin film transistor T4 may be connected to the first capacitor electrode CE1 of the storage capacitor Cst, the compensation source area of the compensation thin film transistor T3, and the drive gate electrode of the drive thin film transistor T1. The first initialization thin film transistor T4 may be turned on depending on the previous scan signal Sn−1 transmitted through the previous scan line SLp and may perform an initialization operation of initializing the voltage of the drive gate electrode of the drive thin film transistor T1 by transmitting the initialization voltage Vint to the drive gate electrode of the drive thin film transistor T1.

An operation control gate electrode of the operation control thin film transistor T5 may be connected to the emission control line ECL. An operation control source area of the operation control thin film transistor T5 may be connected with the drive voltage line PL. An operation control drain area of the operation control thin film transistor T5 may be connected with the drive source area of the drive thin film transistor T1 and the switching drain area of the switching thin film transistor T2.

An emission control gate electrode of the emission control thin film transistor T6 may be connected to the emission control line ECL. An emission control source area of the emission control thin film transistor T6 may be connected to the drive drain area of the drive thin film transistor T1 and the compensation drain area of the compensation thin film transistor T3. An emission control drain area of the emission control thin film transistor T6 may be electrically connected to a second initialization drain area of the second initialization thin film transistor T7 and the pixel electrode of the light emitting element LD.

The operation control thin film transistor T5 and the emission control thin film transistor T6 may be simultaneously turned on depending on the emission control signal En transmitted through the emission control line ECL and may allow the drive voltage ELVDD to be transmitted to the light emitting element LD such that the drive current ILD flows through the light emitting element LD.

A second initialization gate electrode of the second initialization thin film transistor T7 may be connected to the next scan line SLn. The second initialization drain area of the second initialization thin film transistor T7 may be connected to the emission control drain area of the emission control thin film transistor T6 and the pixel electrode of the light emitting element LD. The second initialization source area of the second initialization thin film transistor T7 may be connected to the second initialization voltage line VL2 and may receive an anode initialization voltage Aint. The second initialization thin film transistor T7 may be turned on depending on the next scan signal Sn+1 transmitted through the next scan line SLn and may initialize the pixel electrode of the light emitting element LD.

In an embodiment, the second initialization thin film transistor T7 may be connected to the emission control line ECL and may be driven depending on the emission control signal En. The positions of the source areas and the drain areas may be interchanged with each other depending on the types (a p-type or an n-type) of the transistors.

The storage capacitor Cst may include the first capacitor electrode CE1 and a second capacitor electrode CE2. The first capacitor electrode CE1 of the storage capacitor Cst may be connected with the drive gate electrode of the drive thin film transistor T1, and the second capacitor electrode CE2 of the storage capacitor Cst may be connected with the drive voltage line PL. Charges corresponding to the difference between a drive gate electrode voltage of the drive thin film transistor T1 and the drive voltage ELVDD may be stored in the storage capacitor Cst.

A boosting capacitor Cbs may include a first capacitor electrode CE1' and a second capacitor electrode CE2'. The first capacitor electrode CE1' of the boosting capacitor Cbs may be connected to the first capacitor electrode CE1 of the storage capacitor Cst, and the second capacitor electrode CE2' of the boosting capacitor Cbs may receive the first scan signal Sn. The boosting capacitor Cbs may compensate for a voltage drop of a gate terminal by increasing the voltage of the gate terminal of the drive thin film transistor T1 at the time in case that the supply of the first scan signal Sn is stopped.

An operation of each pixel PX according to an embodiment is as follows.

In case that the previous scan signal Sn−1 is supplied through the previous scan line SLp during an initialization period, the first initialization thin film transistor T4 may be turned on in response to the previous scan signal Sn−1, and the drive thin film transistor T1 may be initialized by the initialization voltage Vint supplied from the first initialization voltage line VL1.

In case that the first scan signal Sn and the second scan signal Sn' are supplied through the first scan line SL1 and the second scan line SL2 during a data programming period, the switching thin film transistor T2 and the compensation thin film transistor T3 may be turned on in response to the first scan signal Sn and the second scan signal Sn'. At this time, the drive thin film transistor T1 may be diode-connected and forward-biased by the turned-on compensation thin film transistor T3.

A compensation voltage Dm+Vth (Vth being a negative value), which is the difference between the data signal Dm supplied from the data line DL and the threshold voltage Vth of the drive thin film transistor T1, may be applied to the drive gate electrode of the drive thin film transistor T1.

The drive voltage ELVDD and the compensation voltage Dm+Vth may be applied to the opposite ends of the storage capacitor Cst, and charges corresponding to the difference between the voltages at the opposite ends may be stored in the storage capacitor Cst.

During an emission period, the operation control thin film transistor T5 and the emission control thin film transistor T6 may be turned on by the emission control signal En supplied from the emission control line ECL. The drive current ILD depending on the difference between the voltage of the drive gate electrode of the drive thin film transistor T1 and the drive voltage EVLDD may be generated. The drive current ILD may be supplied to the light emitting element LD through the emission control thin film transistor T6.

In this embodiment, at least one of the thin film transistors T1 to T7 may include a semiconductor layer containing oxide, and the rest may include a semiconductor layer containing silicon.

By way of example, the drive thin film transistor T1 directly affecting the brightness of the display device may include a semiconductor layer formed of polycrystalline silicon having high reliability and may implement a high-resolution display device accordingly.

An oxide semiconductor may have high carrier mobility and low leakage current, and therefore a voltage drop may not be great even though operating time is long. For example, the color of an image may not be greatly changed depending on a voltage drop even in a low-frequency operation, and therefore the low-frequency operation may be possible.

Because the oxide semiconductor has an advantage of low leakage current as described above, at least one of the compensation thin film transistor T3 connected with the drive gate electrode of the drive thin film transistor T1, the first initialization thin film transistor T4, or the second initialization thin film transistor T7 may be employed as an oxide semiconductor to reduce power consumption while preventing leakage current that is likely to flow to the drive gate electrode.

Figure 3:
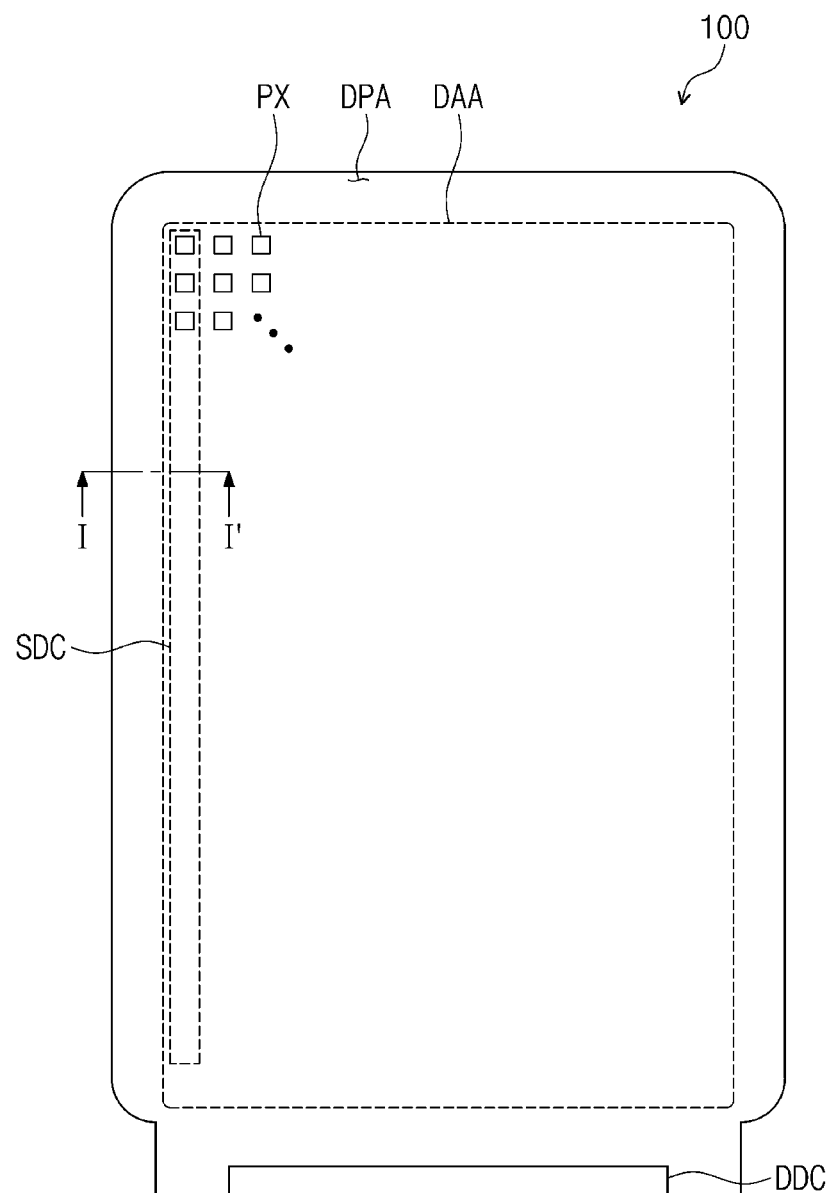
FIG. 3 is a schematic plan view illustrating a display panel according to an embodiment.

FIG. 3 is a schematic plan view illustrating the display panel 100 according to an embodiment. Some or a number of components are omitted in FIG. 3. Hereinafter, the disclosure will be described with reference to FIG. 3.

As illustrated in FIG. 3, the display panel 100 may include a plane defined by the first direction DR1 and the second direction DR2. The thickness direction of the display panel 100 may be a third direction DR3. A front surface (or, an upper surface) and a rear surface (or, a lower surface) of the display panel 100 may be defined with respect to the third direction DR3.

The display panel 100 may be divided into a display area DAA and a surrounding area DPA. The display area DAA may include pixels PX. The pixels PX may be spaced apart from each other.

Each of the pixels PX may correspond to an area where an organic light emitting element to be described below is disposed and may correspond to an area where a light emitting element layer of the organic light emitting element is disposed. Detailed description thereabout will be given below.

The surrounding area DPA may be adjacent to the display area DAA. In this embodiment, the surrounding area DPA is illustrated in a shape surrounding the periphery of the display area DAA. In this embodiment, the scan driver circuit SDC and the data driver circuit DDC may be mounted on the display panel 100. The scan driver circuit SDC and the data driver circuit DDC may be spaced apart from each other.

The scan driver circuit SDC may be disposed on the display area DAA. The scan driver circuit SDC may overlap at least some or a number of the pixels PX on the plane. Because the scan driver circuit SDC overlaps pixels PX, the area of the surrounding area DPA may be decreased, and thus a display device having a narrow bezel may be readily implemented.

The scan driver circuit SDC may include two circuits divided from each other. The two scan driver circuits SDC may be spaced apart from each other in a left or right direction with the center of the display area DAA therebetween. By way of example, two or more scan driver circuits SDC may be provided. However, the disclosure is not limited to any one embodiment.

The data driver circuit DDC may be disposed on the surrounding area DPA. This is illustrative, and the data driver circuit DDC may be disposed on the display area DAA. Some or a number of the pixels PX may overlap the data driver circuit DDC on the plane.

The data driver circuit DDC may be formed in a same process as the scan driver circuit SDC. However, this is illustrative, and in the electronic device according to an embodiment, the data driver circuit DDC may be provided as a separate circuit board independent from the display panel 100 and connected to the display panel 100 and is not limited to any one embodiment.

Figure 4:
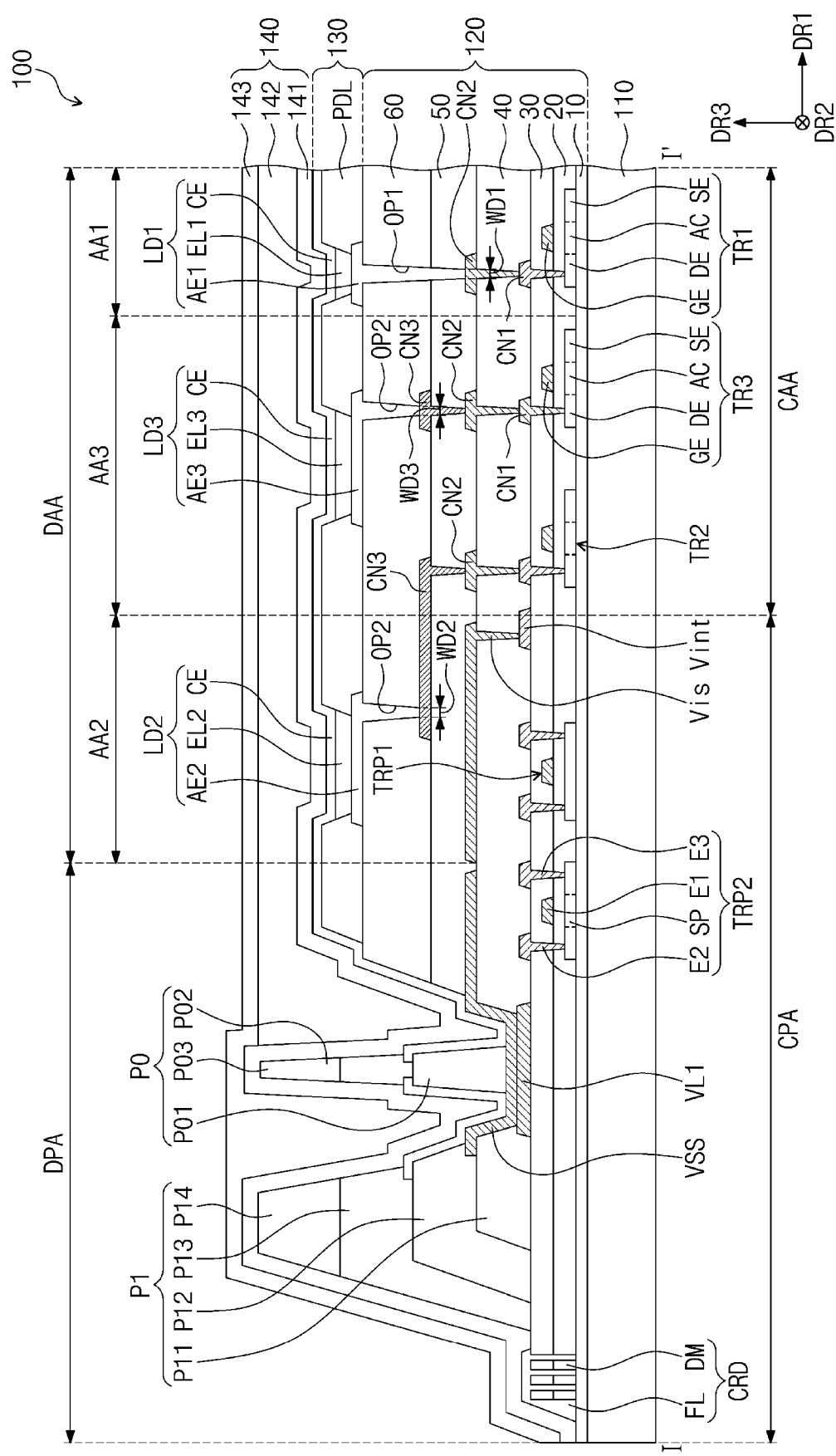
FIG. 4 is a schematic sectional view taken along line I-I' illustrated in FIG. 3.

FIG. 4 is a sectional view taken along line I-I' illustrated in FIG. 3.

Referring to FIG. 4, the display panel 100 may include a base layer 110, a circuit layer 120, the light emitting element layer 130, and an encapsulation layer 140. The base layer 110 may be a member that provides a base surface on which the circuit layer 120 is disposed. The base layer 110 may be a rigid substrate, or a flexible substrate that can be bent, folded, or rolled. The base layer 110 may be a glass substrate, a metal substrate, a polymer substrate, or the like within the spirit and the scope of the disclosure. However, without being limited thereto, the base layer 110 may be an inorganic layer, an organic layer, or a composite layer.

The base layer 110 may have a multi-layer structure. For example, the base layer 110 may include a first synthetic resin layer, an intermediate layer having a multi-layer structure or a single-layer structure, and a second synthetic resin layer disposed on the intermediate layer. The intermediate layer may be referred to as the base barrier layer. The intermediate layer may include, but is not particularly limited to, a silicon oxide (SiOx) layer and an amorphous silicon layer disposed on the silicon oxide layer. For example, the intermediate layer may include at least one of a silicon oxide layer, a silicon nitride layer, a silicon oxynitride layer, or an amorphous silicon layer.

Each of the first and second synthetic layers may contain a polyimide-based resin. By way of example, each of the first and second synthetic layers may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin. A "~~"-based resin used herein may refer to a resin containing a "~~" functional group.

The base layer 110 according to the disclosure may be divided into the display area DAA and the surrounding area DPA on the plane. The display area DAA may include a first area AA1, a second area AA2, and a third area AA3. As described above, the display area DAA may be an area where an image is displayed, and the surrounding area DPA may be an area adjacent to the display area DAA.

The circuit layer 120 may be disposed on the base layer 110. The circuit layer 120 may include an insulating layer, a semiconductor pattern, a conductive pattern, a signal line, and the like within the spirit and the scope of the disclosure. The insulating layer, a semiconductor layer, and a conductive layer may be formed on the base layer 110 by a method such as coating, deposition, or the like and may be selectively patterned by performing a photolithography process a plurality of times. Thereafter, the semiconductor pattern, the conductive pattern, and the signal line, which are included in the circuit layer 120, may be formed.

The circuit layer 120 may include insulating layers 10, 20, 30, 40, 50, and 60, a pixel circuit, and a driver circuit. The base layer 110 may be divided into a pixel circuit area CAA and a driver circuit area CPA. The pixel circuit area CAA may be defined in the display area DAA, and the driver circuit area CPA may be defined to overlap a portion of the display area DAA and the surrounding area DPA. The pixel circuit area CAA and the driver circuit area CPA may be distinguished from each other depending on components disposed under or below light emitting elements LD1, LD2, and LD3, for example, an arrangement of the circuit layer 120.

By way of example, the pixel circuit constituting the pixels PX (refer to FIG. 1) may be disposed in the pixel circuit area CAA. Three pixel transistors TR1, TR2, and TR3 of the pixel circuit are illustrated in FIG. 4. The three pixel transistors TR1, TR2, and TR3 may be connected to the three light emitting elements LD1, LD2, and LD3, respectively, which are distinguished from one another.

For example, the three light emitting elements LD1, LD2, and LD3 may include the first light emitting element LD1, the second light emitting element LD2, and the third light emitting element LD3 that are disposed in the first area AA1, the second area AA2, and the third area AA3, respectively.

For example, the pixel transistors TR1, TR2, and TR3 may include the first pixel transistor TR1 disposed in the first area AA1, and the second pixel transistor TR2 and the third pixel transistor TR3 that are disposed in the third area AA3.

In this embodiment, the first insulating layer 10 may be disposed on the base layer 110. The pixel transistors TR1, TR2, and TR3 may be disposed on the first insulating layer 10.

The first insulating layer 10 may include a barrier layer and a buffer layer. The barrier layer and the buffer layer may be inorganic layers. However, this is illustrative, and the first insulating layer 10 may include one or more layers. The first insulating layer 10 may include organic layers and is not limited to any one embodiment.

In case that the first insulating layer 10 may include the buffer layer, the first insulating layer 10 may prevent diffusion of metal atoms or impurities from the base layer 110 to the pixel transistors TR1, TR2, and TR3. Furthermore, the first insulating layer 10 may allow the pixel transistors TR1, TR2, and TR3 to be uniformly formed, by adjusting the speed at which heat is provided during a crystallization process for forming the pixel transistors TR1, TR2, and TR3.

Each of the pixel transistors TR1, TR2, and TR3 may include a semiconductor pattern SP and a control electrode GE. The semiconductor pattern SP may contain a semiconductor material such as silicon, metal oxide, or the like within the spirit and the scope of the disclosure.

The semiconductor pattern SP may include a channel AC, a source SE, and a drain DE. The channel AC, the source SE, and the drain DE may be portions divided from one another on the plane. The channel AC may have a lower conductivity than the source SE and the drain DE.

In this embodiment, the source SE and the drain DE may contain reduced metal. The source CE and the drain DE may function as a source electrode and a drain electrode of the first pixel transistor TR1, respectively. However, this is illustrative, and the first pixel transistor TR1 may further include a separate source electrode and a separate drain electrode connected to the source CE and the drain DE and is not limited to any one embodiment.

The control electrode GE may have conductivity. The control electrode GE may be spaced apart from the semiconductor pattern SP with the second insulating layer 20 therebetween. The control electrode GE may overlap the channel AC of the semiconductor pattern SP on the plane. The second insulating layer 20 may be an inorganic layer and may have a single-layer structure or a multi-layer structure.

The third insulating layer 30, the fourth insulating layer 40 (or, the first intermediate insulating layer), the fifth insulating layer 50 (or, the second intermediate insulating layer), and the sixth insulating layer (or, the third intermediate insulating layer) may be sequentially stacked each other on the pixel transistors TR1, TR2, and TR3. Each of the third to sixth insulating layers 30, 40, 50, and 60 may include an organic layer, or an organic layer and an inorganic layer stacked on each other.

A first connecting electrode CN1 may be disposed between the third insulating layer 30 and the fourth insulating layer 40. First connecting electrodes CN1 may be provided. The first connecting electrodes CN1 may pass through the third insulating layer 30 and the second insulating layer 20 and may be connected to the pixel transistors TR1, TR2, and TR3, respectively. Although the first connecting electrodes CN1 are illustrated as being connected to the drains DE in this embodiment, this is illustrative, and the first connecting electrodes CN1 may be connected to the sources SE and are not limited to any one embodiment.

A second connecting electrode CN2 (or, a first conductive pattern) may be disposed between the fourth insulating layer 40 and the fifth insulating layer 50. Second connecting electrodes CN2 may be provided. The second connecting electrodes CN2 may pass through the fourth insulating layer 40 and may be connected to the first connecting electrodes CN1. One of the second connecting electrodes CN2 may be connected to the first light emitting element LD1.

A third connecting electrode CN3 (or, a second conductive pattern) may be disposed between the fifth insulating layer 50 and the sixth insulating layer 60. Third connecting electrodes CN3 may be provided. The third connecting electrodes CN3 may pass through the fifth insulating layer 50 and may be connected to the second connecting electrodes CN2. The third connecting electrodes CN3 may be connected to the second light emitting element LD2 and the third light emitting element LD3.

Each of the first connecting electrodes CN1, the second connecting electrodes CN2, and the third connecting electrodes CN3 may independently contain various materials, such as metal, transparent conductive oxide, a conductive polymer, and the like within the spirit and the scope of the disclosure. For example, the third connecting electrodes CN3 may contain transparent conductive oxide.

The first light emitting element LD1 may be connected to the second connecting electrode CN2 disposed in the first area AA1. By way of example, the first light emitting element LD1 may make contact with or direct contact with the upper surface of the second connecting electrode CN2 through a first through-hole OP1 penetrating the fifth insulating layer 50 and the sixth insulating layer 60. The width of the upper surface of the second connecting electrode CN2 to which the first light emitting element LD1 is connected and that is exposed by the first through-hole OP1 may be defined as a first width WD1. The first width WD1 may be a value measured in the first direction DR1.

The second connecting electrode CN2 to which the first light emitting element LD1 is connected may be connected to the first connecting electrode CN1 disposed in the first area AA1.

The second connecting electrode CN2 and the first connecting electrode CN1 that are connected to the first light emitting element LD1 may be connected to the first pixel transistor TR1 disposed in the first area AA1. For example, the first light emitting element LD1 and the first pixel transistor TR1 may be disposed in a same area.

The second light emitting element LD2 may be connected to the third connecting electrode CN3 that overlaps the second area AA2 and the third area AA3. By way of example, the second light emitting element LD2 may make contact with or direct contact with the upper surface of the third connecting electrode CN3 through a second through-hole OP2 penetrating the sixth insulating layer 60. The width of the upper surface of the third connecting electrode CN3 to which the second light emitting element LD2 is connected and that is exposed by the second through-hole OP2 may be defined as a second width WD2. The second width WD2 may be a value measured in the first direction DR1.

The second light emitting element LD2 may be connected to the third connecting electrode CN3 in the second area AA2.

The third connecting electrode CN3 to which the second light emitting element LD2 is connected may be connected to the second connecting electrode CN2 disposed in the third area AA3. The second connecting electrode CN2 may be connected to the second pixel transistor TR2 disposed in the third area AA3.

The third connecting electrode CN3 connected to the second light emitting element LD2 may have a relatively larger planar area than the second connecting electrode CN2 connected to the first light emitting element LD1 or the third connecting electrode CN3 connected to the third light emitting element LD3.

The third connecting electrode CN3 connected to the second light emitting element LD2 may connect the second light emitting element LD2 and the second pixel transistor TR2 that are disposed in different areas.

The third light emitting element LD3 may be connected to the third connecting electrode CN3 disposed in the third area AA3. By way of example, the third light emitting element LD3 may make contact with or direct contact with the upper surface of the third connecting electrode CN3 through a second through-hole OP2 penetrating the sixth insulating layer 60. The width of the upper surface of the third connecting electrode CN3 to which the third light emitting element LD3 is connected and that is exposed by the second through-hole OP2 may be defined as a third width WD3. The third width WD3 may be a value measured in the first direction DR1.

The third connecting electrode CN3, the second connecting electrode CN2, and the first connecting electrode CN1 that are connected to the third light emitting element LD3 may be connected to the third pixel transistor TR3 disposed in the third area AA3. For example, the third light emitting element LD3 and the third pixel transistor TR3 may be disposed in a same area. A first height H1 may be measured from the upper surface of the second connecting electrode CN2 to a lower surface of the first electrode AE1. Similarly, a second height H2 may be measured from the upper surface of the third connecting electrode CN3 to a lower surface of the first electrode AE2. Despite the length difference of the first height H1 and the second height H2, the first width WD1 may be equal to the second width WD2.

The light emitting element layer 130 may be disposed on the circuit layer 120. The light emitting element layer 130 may include light emitting elements. For example, the light emitting element layer 130 may include an organic light emitting material, an inorganic light emitting material, an organic-inorganic light emitting material, a quantum dot, a quantum rod, a micro-LED, or a nano-LED.

The light emitting elements LD1, LD2, and LD3 may be disposed on the sixth insulating layer 60 and may be electrically connected to the corresponding pixel transistors TR1, TR2, and TR3 through the connecting electrodes CN1, CN2, and CN3. The encapsulation layer 140 may be disposed on the light emitting element layer 130. The encapsulation layer 140 may protect the light emitting element layer 130 from foreign matter such as moisture, oxygen, and dust particles.

The encapsulation layer 140 may be disposed on the light emitting element layer 130. The encapsulation layer 140 may include an inorganic layer 141, an organic layer 142, and an inorganic layer 143 sequentially stacked each other. However, layers constituting the encapsulation layer 140 are not limited thereto.

The inorganic layers 141 and 143 may protect the light emitting element layer 130 for moisture and oxygen, and the organic layer 142 may protect the light emitting element layer 130 from foreign matter such as dust particles. The inorganic layers 141 and 143 may include a silicon nitride layer, a silicon oxy-nitride layer, a silicon oxide layer, a titanium oxide layer, or an aluminum oxide layer. The organic layer 142 may include, but is not limited to, an acrylate-based organic layer.

As described above, the light emitting elements LD1, LD2, and LD3 may include the first light emitting element LD1 disposed in the first area AA1, the second light emitting element LD2 disposed in the second area AA2, and the third light emitting element LD3 disposed in the third area AA3. First light emitting elements LD1, second light emitting elements LD2, and third light emitting elements LD3 may be provided. However, for ease of description, a single first light emitting element LD1, a single second light emitting element LD2, and a single third light emitting element LD3 may be provided in this embodiment.

The first light emitting element LD1 may be disposed in the first area AA1 in which the first pixel transistor TR1 connected thereto is disposed. The first light emitting element LD1 may overlap the first pixel transistor TR1 connected thereto on the plane. The first area AA1 may be defined in the pixel circuit area CAA.

The first light emitting element LD1 may include a first electrode AE1, a second electrode CE, and a first emissive layer EL1. The first electrode AE1 may be disposed on the sixth insulating layer 60. The first electrode AE1 may pass through the sixth insulating layer 60 and may be connected to the second connecting electrode CN2.

The first electrode AE1 may include a reflective layer formed of Ag, Mg, Al, Pt, Pd, Au, Ni, Nd, Ir, Cr, or a compound thereof and a transparent or translucent electrode layer formed on the reflective layer. The transparent or translucent electrode layer may contain at least one selected from the group consisting of indium tin oxide (ITO), indium zinc oxide (IZO), indium gallium zinc oxide (IGZO), zinc oxide (ZnOx), or indium oxide ($In_2O_3$) and aluminum-doped zinc oxide (AZO). For example, the first electrode AE1 may contain ITO/Ag/ITO.

A pixel defining film PDL may include an opening for exposing at least a portion of the first electrode AE1. The pixel defining film PDL may be disposed on the sixth insulating layer 60. In this embodiment, the pixel defining film PDL may have a property of absorbing light. For example, the pixel defining film PDL may be black in color. The pixel defining film PDL may include a black coloring agent. For example, the black coloring agent may include a black dye or a black pigment, or may contain carbon black, metal such as chromium, or oxide thereof. The pixel defining film PDL may contain an organic material and/or an inorganic material.

The first emissive layer EL1 may be disposed in an opening defined in the pixel defining film PDL. The first emissive layer EL1 may contain an organic light emitting material and/or an inorganic light emitting material. The first light emitting element LD1 may generate light by exciting the first emissive layer EL1 depending on a potential difference between the first electrode AE1 and the second electrode CE.

The second electrode CE may be disposed on the pixel defining film PDL. The second electrode CE may be provided in an integrated shape covering or overlapping light emitting element layers. The second electrode CE may be formed on the entire surface of the display area DAA.

Although not illustrated, a hole control layer may be disposed between the first electrode AE1 and the first emissive layer EL1. The hole control layer may include a hole transporting layer and may further include a hole injection layer. An electron control layer may be disposed between the first emissive layer EL1 and the second electrode CE. The electron control layer may include an electron transporting layer and may further include an electron injection layer. The hole control layer and the electron control layer may be commonly formed for the pixels PX (refer to FIG. 1) by using an open mask.

The second light emitting element LD2 may be disposed in the second area AA2 of the display area DAA. In this embodiment, the second area AA2 may be an area where light emitting elements not overlapping pixel transistors connected thereto are disposed in the display area AA. Furthermore, the second area AA2 may be an area overlapping the driver circuit area CPA and may be an area overlapping the scan driver circuit SDC (refer to FIG. 3).

Circuit components other than the pixel circuit, for example, the scan driver circuit SDC (refer to FIG. 1), an initialization voltage line Vint, a first initialization voltage line VL1, a shielding line Vis, and the like may be disposed in the driver circuit area CPA.

The initialization voltage line Vint may be disposed in the display area DAA and may overlap the second area AA2. A conductive line Ci disposed on the fourth insulating layer 40 may pass through the fourth insulating layer 40 and may be connected to the initialization voltage line Vint. The conductive line Ci may extend toward the pixel circuit area CAA and may provide an initialization voltage to the pixel driver circuit.

The shielding line Vis may be connected to the initialization voltage line Vint. The shielding line Vis may electrically shield the second light emitting element LD2. The shielding line Vis may prevent noise from being generated in the second light emitting element LD2 by drive transistors TRP1 and TRP2.

The scan driver circuit SDC and the initialization voltage line Vint may be disposed in a region of the driver circuit area CPA that overlaps the display area DAA. For ease of description, some or a number of drive transistors TRP1 and TRP2 of the scan driver circuit SDC are illustrated in FIG. 4.

The drive transistor TRP1 may include a semiconductor pattern SP, a control electrode E1, an input electrode E2, and an output electrode E3. The drive transistors TRP1 and TRP2 may be formed through a same process as the pixel transistors TR1, TR2, and TR3. The drive transistors TRP1 and TRP2 may be disposed so as not to overlap the pixel transistors TR1, TR2, and TR3 on the plane.

The second light emitting element LD2 may be disposed in a different area from the second pixel transistor TR2. The second light emitting element LD2 may not overlap the second pixel transistor TR2 on the plane and may overlap the drive transistors TRP1 and TRP2, which constitute the scan driver circuit SDC, on the plane. Accordingly, the third connecting electrode CN3 may extend from the third area AA3 to the second area AA2 to connect the second light emitting element LD2 and the second pixel transistor TR2.

The third light emitting element LD3 may be disposed in the third area AA3. The third area AA3 may be an area defined between the first area AA1 and the second area AA2 and may be an area overlapping a portion of the pixel circuit area CAA.

Each of the second and third light emitting elements LD2 and LD3 may be provided in the same structure as the first light emitting element LD1. For example, the second light emitting element LD2 may include a first electrode AE2, a second emissive layer EL2, and a common electrode CE, and the third light emitting element LD3 may include a first electrode AE3, a third emissive layer EL3, and a common electrode CE. However, this is illustrative, and the first to third light emitting elements LD1, LD2, and LD3 may have different structures and are not limited to any one embodiment.

A power voltage pattern VSS may be connected to the first initialization voltage line VL1 and may receive the first power voltage.

The display panel 100 according to this embodiment may include dams P0 and P1 and a crack dam CRD. The dams P0 and P1 may be disposed along the periphery of the display area DAA on the plane. The dams P0 and P1 may prevent overflow of the organic layer 142. The dams P0 and P1 may include the first dam P0 and the second dam P1.

The first dam P0 may be closer to the display area DAA than the second dam P1. The first dam P0 may overlap the first initialization voltage line VL1. The first dam P0 may include a first layer P01, a second layer P02, and a third layer P03. Each of the first layer P01, the second layer P02, and the third layer P03 may be formed of an insulating material. In this embodiment, the first layer P01 may be formed of a same material or a similar material as the fifth insulating layer 50, and the second layer P02 and the third layer P03 may be formed of a same material or a similar material as the sixth insulating layer 60 and/or the pixel defining film PDL.

The second dam P1 may be farther away from the display area DAA than the first dam P0. In this embodiment, the second dam P1 may include a first layer P11, a second layer P12, a third layer P13, and a fourth layer P14. For example, the first layer P11 may be formed of a same material or a similar material as the fourth insulating layer 40, the second layer P12 may be formed of a same material or a similar material as the fifth insulating layer 50, and the third layer P13 and the fourth layer P14 may be formed of a same material or a similar material as the sixth insulating layer 60 and/or the pixel defining film PDL. The first dam P0 and the second dam P1 may have a same layer structure, and an additional dam other than the first dam P0 and the second dam P1 may be disposed in the surrounding area DPA. However, the disclosure is not limited to any one embodiment.

The crack dam CRD may be disposed in the surrounding area DPA and may be disposed at distal ends of the second insulating layer 20 and the third insulating layer 30. The crack dam CRD may include a dam portion DM and a filling portion FL. The dam portion DM may include insulating patterns spaced apart from each other in a direction from the display area DAA toward the periphery of the display panel 100. The insulating patterns may be formed of a same material or a similar material as the second insulating layer 20 and the third insulating layer 30 and may be simultaneously formed.

The filling portion FL may contain an organic material. The filling portion FL may be formed of a material having a higher ductility than the dam portion DM. The filling portion FL may cover or overlap the dam portion DM and may fill spaces between the insulating patterns.

Figure 5:
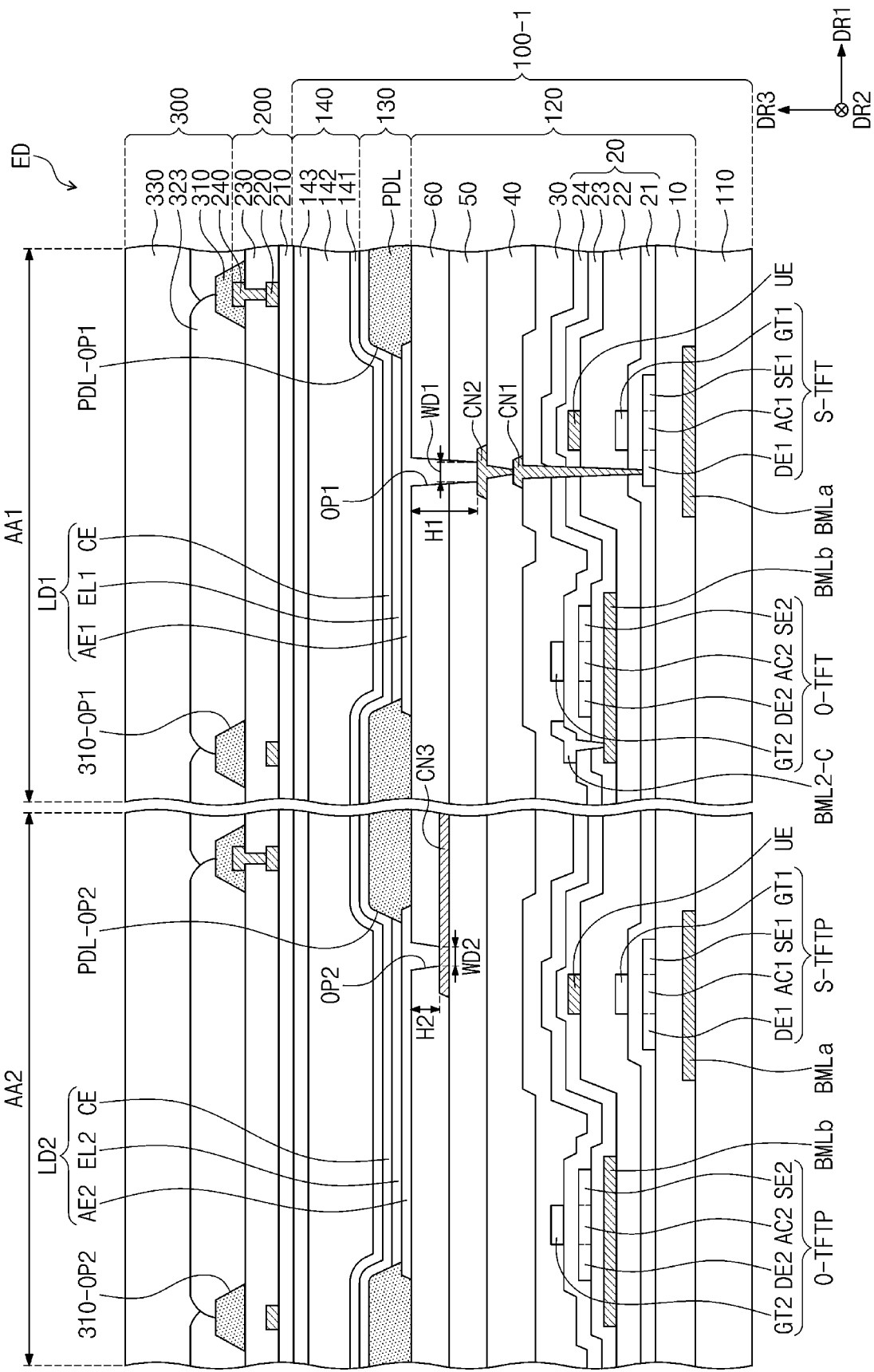
FIG. 5 is a schematic sectional view of an electronic device according to an embodiment.

FIG. 5 is a sectional view of an electronic device ED according to an embodiment. For ease of description, a portion of a first area AA1 and a portion of a second area AA2 are illustrated in FIG. 5. Components identical to the components described above with reference to FIGS. 1 to 4 will be assigned with identical reference numerals, and repetitive descriptions will be omitted.

Referring to FIG. 5, the electronic device ED according to an embodiment may include a display panel 100-1, a sensor layer 200, and an anti-reflection layer 300.

The display panel 100-1 according to an embodiment may include a transistor O-TFT (hereinafter, referred to as the oxide thin film transistor) including an oxide semiconductor and a transistor S-TFT (hereinafter, referred to as the silicon thin film transistor) including a poly-silicon semiconductor.

A first rear metal layer BMLa may be disposed under or below the silicon thin film transistor S-TFT, and a second rear metal layer BMLb may be disposed under or below the oxide thin film transistor O-TFT. The first and second rear metal layers BMLa and BMLb may be disposed under or below the silicon thin film transistor S-TFT and the oxide thin film transistor O-TFT to overlap the silicon thin film transistor S-TFT and the oxide thin film transistor O-TFT and may protect the silicon thin film transistor S-TFT and the oxide thin film transistor O-TFT. The first and second rear metal layers BMLa and BMLb may prevent external light from reaching the silicon thin film transistor S-TFT and the oxide thin film transistor O-TFT.

The first rear metal layer BMLa may be disposed to correspond to at least a partial area of a circuit of a pixel PX (refer to FIG. 2). In an embodiment, the first rear metal layer BMLa may be disposed to overlap a drive thin film transistor T1 (refer to FIG. 2) implemented with the silicon thin film transistor S-TFT.

The first rear metal layer BMLa may be disposed between a base layer 110 and a first insulating layer 10. In an embodiment, the first rear metal layer BMLa may be disposed on the base layer 110 in which organic films and inorganic films may be alternately stacked each other, and an inorganic barrier layer may be additionally disposed between the first rear metal layer BMLa and the first insulating layer 10. The first rear metal layer BMLa may be connected with an electrode or a line and may receive a constant voltage or a signal from the electrode or the line. In an embodiment, the first rear metal layer BMLa may be provided in a form isolated from another electrode or line.

The second rear metal layer BMLb may be disposed to correspond to a lower portion of the oxide thin film transistor O-TFT. The second rear metal layer BMLb may be disposed between a second insulating layer 20 and a third insulating layer 30. The second rear metal layer BMLb may be disposed in a same layer as a second capacitor electrode CE2 of a storage capacitor Cst. The second rear metal layer BMLb may be connected with a contact electrode BML2-C and may receive a constant voltage or a signal from the contact electrode BML2-C. The contact electrode BML2-C may be disposed in a same layer as a second gate GT2 of the oxide thin film transistor O-TFT.

Each of the first rear metal layer BMLa and the second rear metal layer BMLb may contain reflective metal. For example, each of the first rear metal layer BMLa and the second rear metal layer BMLb may contain silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), and p+ doped amorphous silicon. The first rear metal layer BMLa and the second rear metal layer BMLb may contain a same material or a similar material, or may contain different materials.

A first semiconductor pattern may be disposed on the first insulating layer 10. The first semiconductor pattern may include a silicon semiconductor. For example, the silicon semiconductor may contain amorphous silicon, polycrystalline silicon, or the like within the spirit and the scope of the disclosure. For example, the first semiconductor pattern may contain low-temperature poly silicon.

Only a portion of the first semiconductor pattern disposed on the first insulating layer 10 is illustrated in FIG. 5, and the first semiconductor pattern may be further disposed in another area. The first semiconductor pattern may be arranged or disposed across pixels according to a specific or given rule. The first semiconductor pattern may have different electrical properties depending on whether the first semiconductor pattern is doped or not. The first semiconductor pattern may include a first area having a high conductivity and a second area having a low conductivity. The first area may be doped with an N-type dopant or a P-type dopant. A P-type transistor may include a doped area doped with a P-type dopant, and an N-type transistor may include a doped area doped with an N-type dopant. The second area may be an undoped area, or may be an area more lightly doped than the first area.

The first area may have a higher conductivity than the second area and may substantially serve as an electrode or a signal line. The second area may substantially correspond to an active area (or, a channel) of a transistor. In other words, a portion of a semiconductor pattern may be an active area of a transistor, another portion may be a source or a drain of the transistor, and another portion may be a connecting electrode or a connecting signal line.

A source area SE1, an active area AC1, and a drain area DE1 of the silicon thin film transistor S-TFT may be formed from the first semiconductor pattern. The source area SE1 and the drain area DE1 may extend from the active area AC1 in opposite directions on the section.

The first insulating layer 10 may be a layer disposed on the base layer 110, and the third insulating layer 30 may be a layer on which a first connecting electrode CN1 is disposed. The display panel 100-1 illustrated in FIG. 5 may include insulating layers disposed between the first insulating layer 10 and the third insulating layer 30, when compared to the display panel 100 illustrated in FIG. 4. For example, the second insulating layer 20 disposed between the first insulating layer 10 and the third insulating layer 30 may include insulating layer 2-1 21, insulating layer 2-2 22, insulating layer 2-3 23, and insulating layer 2-4 24.

Insulating layer 2-1 21 may be disposed on the first insulating layer 10. Insulating layer 2-1 21 may commonly overlap pixels and may cover or overlap the first semiconductor pattern. Insulating layer 2-1 21 may be an inorganic layer and/or an organic layer and may have a single-layer structure or a multi-layer structure. Insulating layer 2-1 21 may contain at least one of aluminum oxide, titanium oxide, silicon oxide, silicon nitride, silicon oxy-nitride, zirconium oxide, or hafnium oxide. In this embodiment, the first insulating layer 10 may be a single layer of silicon oxide. Not only insulating layer 2-1 21 but also insulating layers of a circuit layer 120 to be described below may be inorganic layers and/or organic layers and may have a single-layer structure or a multi-layer structure. The inorganic layers may contain at least one of the aforementioned materials, but are not limited thereto.

A gate GT1 of the silicon thin film transistor S-TFT may be disposed on insulating layer 2-1 21. The gate GT1 may be a portion of a metal pattern. The gate GT1 may overlap the active area AC1. The gate GT1 may function as a mask in a process of doping the first semiconductor pattern. The gate GT1 may contain titanium (TI), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), or the like, but is not particularly limited thereto.

Insulating layer 2-2 22 may be disposed on insulating layer 2-1 21 and may cover or overlap the gate GT1. Insulating layer 2-2 22 may be an inorganic layer and/or an organic layer and may have a single-layer structure or a multi-layer structure. Insulating layer 2-2 22 may contain at least one of silicon oxide, silicon nitride, or silicon oxy-nitride. In this embodiment, insulating layer 2-2 22 may have a multi-layer structure including a silicon oxide layer and a silicon nitride layer.

Insulating layer 2-3 23 may be disposed on insulating layer 2-2 22. Insulating layer 2-3 23 may have a single-layer structure or a multi-layer structure. For example, insulating layer 2-3 23 may have a multi-layer structure including a silicon oxide layer and a silicon nitride layer. An upper electrode UE may be disposed between insulating layer 2-2 22 and insulating layer 2-3 23. The upper electrode UE may at least partially overlap the gate GT1 of the silicon thin film transistor S-TFT disposed under or below the upper electrode UE. The upper electrode UE may be a portion of a metal pattern, or may be a portion of a doped semiconductor pattern. A portion of the gate GT1 and the upper electrode UE overlapping the gate GT1 may define the storage capacitor Cst (refer to FIG. 2). For example, the portion of the gate GT1 may be a first capacitor electrode CE1 (refer to FIG. 2), and the upper electrode UE may be the second capacitor electrode CE2. However, the upper electrode UE may be omitted.

A second semiconductor pattern may be disposed on insulating layer 2-3 23. The second semiconductor pattern may include an oxide semiconductor. A source area SE2, an active area AC2, and a drain area DE2 of the oxide thin film transistor O-TFT may be formed from the second semiconductor pattern. The source area SE2 and the drain area DE2 may extend from the active area AC2 in opposite directions on the section.

Insulating layer 2-4 24 may be disposed on insulating layer 2-3 23. Insulating layer 2-4 24 may commonly overlap pixels and may cover or overlap the second semiconductor pattern. Insulating layer 2-4 24 may contain at least one of aluminum oxide, titanium oxide, silicon oxide, silicon nitride, silicon oxy-nitride, zirconium oxide, or hafnium oxide.

The gate GT2 of the oxide thin film transistor O-TFT may be disposed on insulating layer 2-4 24. The gate GT2 may be a portion of a metal pattern. The gate GT2 may overlap the active area AC2. The gate GT2 may function as a mask in a process of doping the second semiconductor pattern.

The third insulating layer 30 may be disposed on insulating layer 2-4 24 and may cover or overlap the gate GT2. The third insulating layer 30 may be an inorganic layer and/or an organic layer and may have a single-layer structure or a multi-layer structure.

The first connecting electrode CN1 may be disposed on the third insulating layer 30. The first connecting electrode CN1 may be connected to the drain area DE1 of the silicon thin film transistor S-TFT through a contact hole penetrating the first insulating layer 10 and the second insulating layer 20.

A second connecting electrode CN2 may be disposed on a fourth insulating layer 40. The second connecting electrode CN2 may be connected to the first connecting electrode CN1 through a contact hole penetrating the fourth insulating layer 40. A fifth insulating layer 50 may be disposed on the fourth insulating layer 40 and may cover or overlap the second connecting electrode CN2.

A sixth insulating layer 60 may be disposed on the fifth insulating layer 50.

In the first area AA1, a first electrode AE1 of a first light emitting element LD1 may be connected to the second connecting electrode CN2 through a first through-hole OP1. As described above, the first through-hole OP1 may penetrate the fifth insulating layer 50 and the sixth insulating layer 60.

In the second area AA2, a third connecting electrode CN3 may be disposed on the fifth insulating layer 50. The third connecting electrode CN3 may not be disposed in the first area AA1 and may be disposed in the second area AA2.

As illustrated in FIG. 4, the third connecting electrode CN3 may be connected to the second connecting electrode CN2 through a contact hole penetrating the fifth insulating layer 50.

Each of the fourth insulating layer 40, the fifth insulating layer 50, and the sixth insulating layer 60 may be an organic layer. For example, each of the fourth insulating layer 40, the fifth insulating layer 50, and the sixth insulating layer 60 may contain a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vynyl alcohol-based polymer, or a blend thereof.

A scan driver circuit disposed in the second area AA2 may be formed in the same manner as the pixel driver circuit in the first area AA1. By way of example, the scan driver circuit may include a drive transistor S-TFTP (hereinafter, referred to as the silicon drive transistor) including a poly-silicon semiconductor and a drive transistor O-TFTP (hereinafter, referred to as the oxide drive transistor) including an oxide semiconductor. The silicon drive transistor S-TFTP and the oxide drive transistor O-TFTP may have the same structures as the silicon thin film transistor S-TFT and the oxide thin film transistor O-TFT, and repetitive descriptions will hereinafter be omitted.

As described above, a light emitting element layer 130 may be disposed on the circuit layer 120, and an encapsulation layer 140 may be disposed on the light emitting element layer 130.

The sensor layer 200 may be disposed on the display panel 100-1. The sensor layer 200 may be referred to as the sensor, the input sensing layer, or the input sensing panel. The sensor layer 200 may include a base layer 210, a first conductive layer 220, a sensing insulation layer 230, and a second conductive layer 240.

The sensor layer 210 may be disposed on or directly disposed on the display panel 100-1. The base layer 210 may be an inorganic layer containing at least one of silicon nitride, silicon oxy-nitride, or silicon oxide. By way of example, the base layer 210 may be an organic layer containing an epoxy resin, an acrylic resin, or an imide-based resin. The base layer 210 may have a single-layer structure, or may have a multi-layer structure stacked along the third direction DR3.

Each of the first conductive layer 220 and the second conductive layer 240 may have a single-layer structure, or may have a multi-layer structure stacked along the third direction DR3.

The conductive layer having the single-layer structure may include a metal layer or a transparent conductive layer. The metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), indium zinc tin oxide (IZTO), or the like within the spirit and the scope of the disclosure. The transparent conductive layer may contain a conductive polymer such as PEDOT, a metal nano wire, graphene, or the like within the spirit and the scope of the disclosure.

The conductive layer having the multi-layer structure may include metal layers. The meal layers may have, for example, a three-layer structure of titanium/aluminum/titanium. The conductive layer having the multi-layer structure may include at least one metal layer and at least one transparent conductive layer.

The sensing insulation layer 230 may be disposed between the first conductive layer 220 and the second conductive layer 240. The sensing insulation layer 230 may include an inorganic film. The inorganic film may contain at least one of aluminum oxide, titanium oxide, silicon oxide, silicon nitride, silicon oxy-nitride, zirconium oxide, or hafnium oxide.

By way of example, the sensing insulation layer 230 may include an organic film. The organic film may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyimide-based resin, a polyamide-based resin, or a perylene-based resin.

The anti-reflection layer 300 may be disposed on the sensor layer 200. The anti-reflection layer 300 may include a dividing layer 310, color filters 323, and a planarization layer 330.

The material of the dividing layer 310 is not particularly limited as long as it is a material that absorbs light. The dividing layer 310, which is a layer having a black color, may include a black coloring agent in an embodiment. The black coloring agent may include a black dye or a black pigment. The black coloring agent may include carbon black, metal such as chromium, or oxide thereof.

The dividing layer 310 may cover or overlap the second conductive layer 240 of the sensor layer 200. The dividing layer 310 may prevent reflection of external light by the second conductive layer 240. Openings 310-OP1 and 310-OP2 may be defined in the dividing layer 310. The first opening 310-OP1 may overlap the first electrode AE1 of the first light emitting element LD1, and the second opening 310-OP2 may overlap a first electrode AE2 of a second light emitting element LD2.

The color filters 323 may be disposed to overlap the light emitting elements LD1 and LD2, by way of example, the first electrodes AE1 and AE2. The planarization layer 330 may cover or overlap the dividing layer 310 and the color filters 323. The planarization layer 330 may contain an organic material and may provide a flat surface on the upper surface of the planarization layer 330. In an embodiment, the planarization layer 330 may be omitted.

In this embodiment, the sensor layer 200 and the anti-reflection layer 300 are illustrated as being disposed in both the first area AA1 and the second area AA2. However, this is illustrative, and in the electronic device ED according to an embodiment, the sensor layer 200 or the anti-reflection layer 300 may be omitted from the second area AA2 and is not limited to any one embodiment.

Although the above description is based on the shape of the display panel 100 of FIG. 4, the disclosure is not limited thereto and may be identically applied to the display panel 100-1 of FIG. 5.

Figure 6:
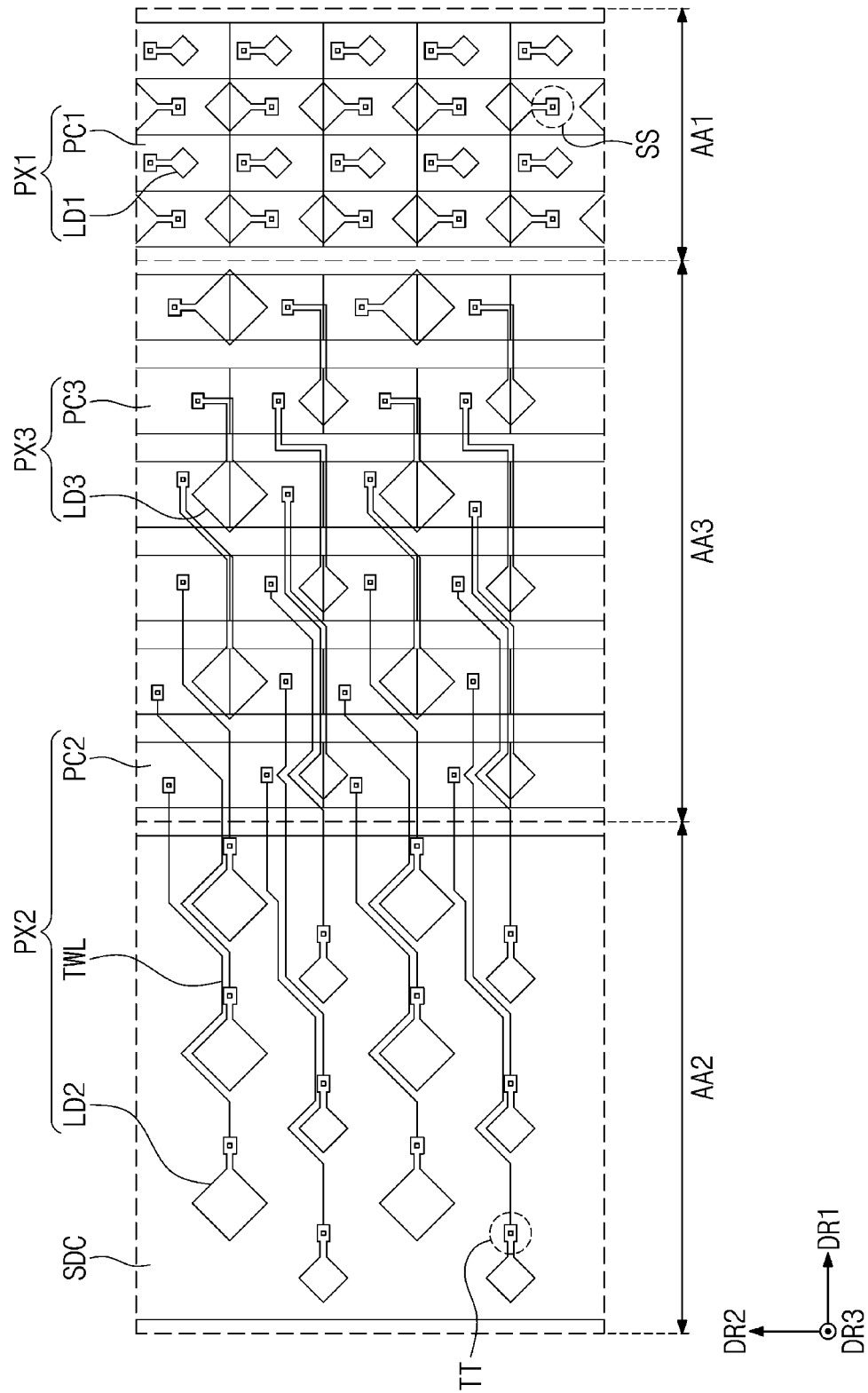
FIG. 6 is a schematic plan view illustrating a portion of the display panel according to an embodiment.

FIG. 6 is a schematic plan view illustrating a portion of the display panel 100 according to an embodiment. Portions of the first to third areas AA1 to AA3 among the areas illustrated in FIG. 4 are illustrated in FIG. 6. Hereinafter, the disclosure will be described with reference to FIG. 6. Components identical to the components described above with reference to FIGS. 1 to 5 will be assigned with identical reference numerals, and repetitive descriptions will be omitted.

Referring to FIG. 6, the display panel 100 may include the pixels PX. The pixels PX may include a first pixel PX1, a second pixel PX2, and a third pixel PX3 divided from one another depending on emissive areas. The first pixel PX1 may emit light in the first area AA1, the second pixel PX2 may emit light in the second area AA2, and the third pixel PX3 may emit light in the third area AA3.

First pixels PX1, second pixels PX2, and third pixels PX3 may be provided. Each of the first to third pixels PX1, PX2, and PX3 may include a red pixel, a green pixel, and a blue pixel and may further include a white pixel according to embodiments.

The first pixel PX1 may include a first light emitting element LD1 and a first pixel circuit PC1 that drives the first light emitting element LD1. The second pixel PX2 may include a second light emitting element LD2 and a second pixel circuit PC2 that drives the second light emitting element LD2. The third pixel PX3 may include a third light emitting element LD3 and a third pixel circuit PC3 that drives the third light emitting element LD3.

The shapes of the first, second, and third light emitting elements LD1, LD2, and LD3 illustrated in this embodiment may correspond to the shapes of emission patterns, substantially, the shapes of openings defined in the pixel defining film PDL. Although the first, second, and third light emitting elements LD1, LD2, and LD3 are illustrated as having a rhombic shape in this embodiment, the first to third light emitting elements LD1 to LD3 may have various shapes, such as a polygonal shape, a circular shape, an oval shape, a shape having at least one curved side or a curved side, an irregular shape, and the like, and are not limited to any one embodiment. It is to be understood that the shapes disclosed herein may include shapes substantially identical or similar to the shapes.

First light emitting elements LD1, second light emitting elements LD2, and third light emitting elements LD3 may be provided. The interval between two second light emitting elements LD2 most adjacent to each other among the second light emitting elements LD2 may be greater than the interval between two first light emitting elements LD1 most adjacent to each other among the first light emitting elements LD1. Furthermore, the interval between two third light emitting elements LD3 most adjacent to each other among the third light emitting elements LD3 may be greater than the interval between two first light emitting elements LD1 most adjacent to each other among the first light emitting elements LD1.

The number of second pixels PX2 per unit area or a same area in the second area AA2 may be smaller than the number of first pixel PX1 per unit area or a same area in the first area AA1. For example, the resolution of the second area AA2 may be equal to about ½, ⅜, ⅓, ¼, ⅖, ⅛, ⅑, or 1/16 of the resolution of the first area AA1.

The first pixel PX1 may include the first light emitting element LD1 and the first pixel circuit PC1 that are disposed in the first area AA1. The first light emitting element LD1 may be disposed in a position overlapping the first pixel circuit PC1 on the plane. By way of example, an anode electrode or an emission pattern of the first light emitting element LD1 may be disposed in a position overlapping the first pixel circuit PC1 on the plane.

The second pixel PX2 may include the second light emitting element LD2 disposed in the second area AA2 and the second pixel circuit PC2 disposed in the third area AA3. The second light emitting element LD2 may be disposed in a position overlapping the scan driver circuit SDC on the plane. Accordingly, the second light emitting element LD2 may be disposed in a position not overlapping the second pixel circuit PC2 on the plane.

By way of example, an anode electrode or an emission pattern of the second light emitting element LD2 may be disposed in a position spaced apart from the second pixel circuit PC2 on the plane. Accordingly, the second pixel PX2 may further include a connecting line TWL. The connecting line TWL may electrically connect the second light emitting element LD2 disposed in the second area AA2 and the second pixel circuit PC2 disposed in the third area AA3. The connecting line TWL may correspond to the third connecting electrode CN3 connected to the second light emitting element LD2 among the above-described third connecting electrodes. The connecting line TWL may contain various materials, such as metal, transparent conductive oxide, a conductive polymer, and the like, and is not limited to any one embodiment.

The third pixel PX3 may include the third light emitting element LD3 and the third pixel circuit PC3 that are disposed in the third area AA3. The third light emitting element LD3 may be disposed in the third area AA3 and may be disposed in a position overlapping the third pixel circuit PC3 on the plane or in a position not overlapping the third pixel circuit PC3 on the plane.

Figure 7:
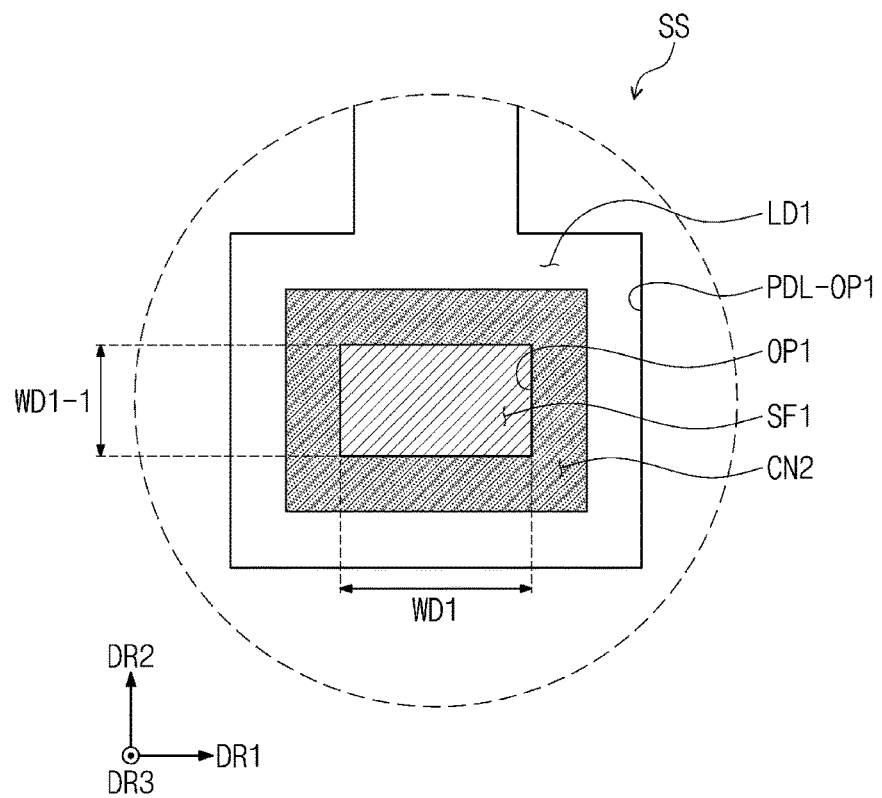
FIG. 7 is an enlarged schematic plan view of area SS illustrated in FIG. 6.
Figure 8:
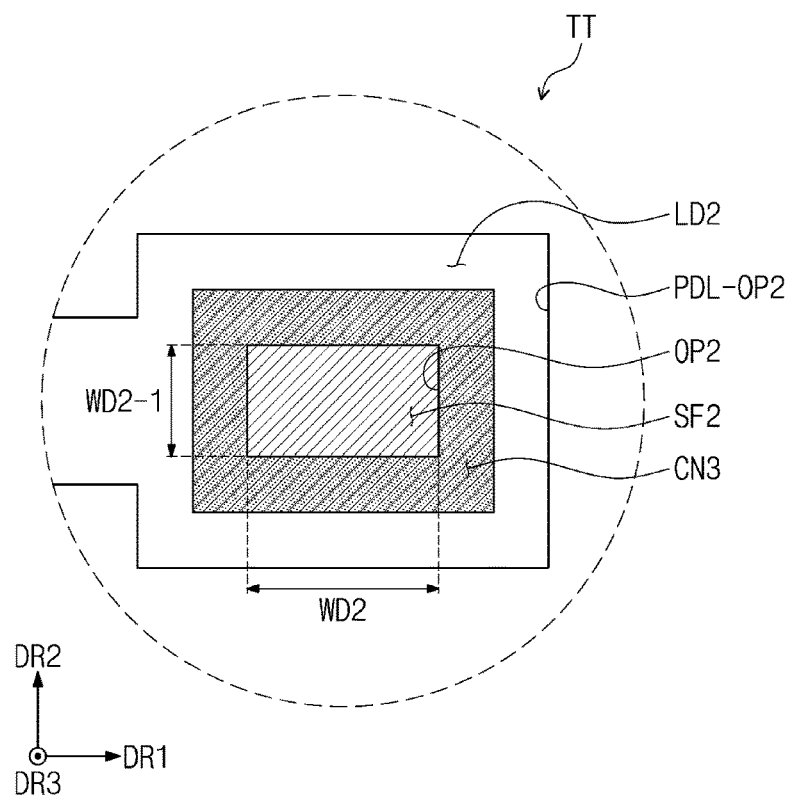
FIG. 8 is an enlarged schematic plan view of area TT illustrated in FIG. 6.

FIG. 7 is an enlarged schematic plan view of area SS illustrated in FIG. 6. FIG. 8 is an enlarged plan view of area TT illustrated in FIG. 6.

FIG. 7 illustrates an enlargement of the portion where the first light emitting element LD1 and the first pixel circuit PC1 are connected.

Referring to FIG. 7, on the plane, the first through-hole OP1 may overlap a first pixel opening PDL-OP1 (PDL-OP1 of FIG. 5). The first through-hole OP1 may have a smaller size than the first pixel opening PDL-OP1. The first pixel opening PDL-OP1 may be an opening defined in the pixel defining film PDL and may expose the first electrode AE1 of the first light emitting element LD1.

Referring to FIGS. 4 and 7 together, the first light emitting element LD1 may be connected to the second connecting electrode CN2 through the first through-hole OP1. The first through-hole OP1 may penetrate the fifth insulating layer 50 and the sixth insulating layer 60 and may expose a first surface SF1 that is a portion of the upper surface of the second connecting electrode CN2, and thus the first light emitting element LD1 may be connected to the first surface SF1. By way of example, the first electrode AE1 of the first light emitting element LD1 may make contact with the first surface SF1.

Although the first surface SF1 is illustrated as having a rectangular shape, the disclosure is not limited thereto, and the first surface SF1 may have various shapes, such as a polygonal shape, a circular shape, an oval shape, a shape having at least one curved side or a curved side, an irregular shape, and the like, and is not limited to any one embodiment.

The horizontal length of the first surface SF1 measured in the first direction DR1 may be a first width WD1, and the vertical length of the first surface SF1 measured in the second direction DR2 may be width 1-1 WD1-1. However, without being limited thereto, the horizontal length and the vertical length may be equal to, or different from, each other.

FIG. 8 illustrates an enlargement of the portion where the second light emitting element LD2 and the second pixel circuit PC2 are connected.

Referring to FIG. 8, on the plane, the second through-hole OP2 may overlap a second pixel opening PDL-OP2. The second through-hole OP2 may have a smaller size than the second pixel opening PDL-OP2. The second pixel opening PDL-OP2 may be an opening defined in the pixel defining film PDL and may expose the first electrode AE2 of the second light emitting element LD2.

The first pixel opening PDL-OP1 may be smaller than the second pixel opening PDL-OP2. This is because the first light emitting element LD1 disposed in the first area AA1 has a smaller size than the second light emitting element LD2 disposed in the second area AA2.

Referring to FIGS. 4 and 8 together, the second light emitting element LD2 may be connected to the second connecting electrode CN2 through the second through-hole OP2. The second through-hole OP2 may penetrate the sixth insulating layer 60 and may expose a second surface SF2 that is a portion of the third connecting electrode CN3, and thus the second light emitting element LD2 may be connected to the second surface SF2. By way of example, the first electrode AE2 of the second light emitting element LD2 may make contact with the second surface SF2.

Although the second surface SF2 is illustrated as having a rectangular shape, the disclosure is not limited thereto, and the second surface SF2 may have various shapes, such as a polygonal shape, a circular shape, an oval shape, a shape having at least one curved side or a curved side, an irregular shape, and the like, and is not limited to any one embodiment.

The horizontal length of the second surface SF2 measured in the first direction DR1 may be a second width WD2, and the vertical length of the second surface SF2 measured in the second direction DR2 may be width 2-1 WD2-1. However, without being limited thereto, the horizontal length and the vertical length may be equal to, or different from, each other. In the display panel 100 according to an embodiment, the second surface SF2 may have substantially the same shape and size as the first surface SF1. By way of example, the first width WD1 may be equal to the second width WD2, and width 1-1 WD1-1 may be equal to width 2-1 WD2-1.

Because the cross-section of the second through-hole OP2 has substantially a same size and shape as the cross-section of the first through-hole OP1, the first surface SF1 exposed by the first through-hole OP1 and the second surface SF2 exposed by the second through-hole OP2 may have substantially the same size and shape.

As illustrated in FIGS. 4 and 5, the first through-hole OP1 and the second through-hole OP2 may have a decreasing cross-sectional area from the light emitting element layer 130 toward the base layer 110. In this specification, "the cross-section of the first through-hole OP1" may refer to the smallest of the cross-sections of the first through-hole OP1, and "the cross-section of the second through-hole OP2" may refer to the smallest of the cross-sections of the second through-hole OP2. For example, the first through-hole OP1 may have the smallest cross-section on the upper surface of the second connecting electrode CN2. For example, the second through-hole OP2 may have the smallest cross-section on the upper surface of the third connecting electrode CN3.

The cross-section of the second through-hole OP2 may have substantially the same shape as the cross-section of the first through-hole OP1 and may have substantially the same width as the cross-section of the first through-hole OP1 in the first direction DR1. The width of the cross-section of a through-hole may refer to the diameter of the through-hole, the horizontal length of the through-hole, or the vertical length of the through-hole on a plane.

For example, the cross-section of the first through-hole OP1 may have substantially the same shape and size as the cross-section of the second through-hole OP2.

The expression "substantially the same" used herein should be understood as meaning the sameness including a process error that is likely to generally occur in a numerical range described in this specification.

In the display panel of the disclosure, the cross-section of the second through-hole OP2 formed through the sixth insulating layer 60 may have substantially the same shape as the cross-section of the first through-hole OP1 formed through the fifth insulating layer 50 and the sixth insulating layer 60, and therefore the area of the third connecting electrode CN3 exposed by the second through-hole OP2 may be substantially the same as the area of the second connecting electrode CN2 exposed by the first through-hole OP1.

Accordingly, the area of the third connecting electrode CN3 disposed to overlap the second area AA2 and the third area AA3 may be adjusted to the minimum. For example, the display panel of the disclosure may efficiently use the space in the circuit layer 120 and may increase, for example, the number of lines disposed in the second area AA2 and the third area AA3 of the circuit layer 120.

In the electronic device of the disclosure, the display area DAA may be expanded by increasing the second area AA2 and the third area AA3.

Figure 9:
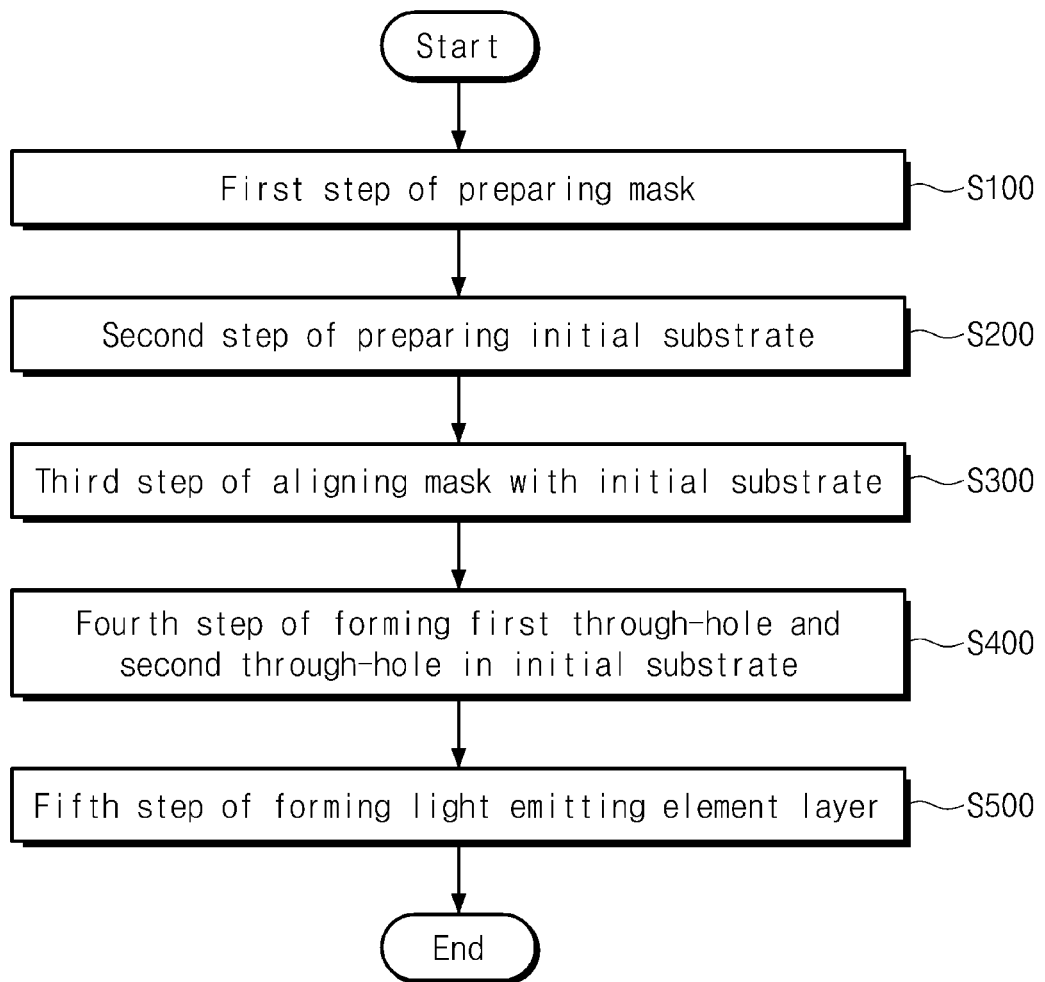
FIG. 9 is a flowchart illustrating a method for manufacturing a display panel according to an embodiment.

FIG. 9 is a flowchart illustrating a method for manufacturing a display panel according to an embodiment of the disclosure.

Referring to FIG. 9, the display panel manufacturing method may include a first step S100 of preparing a mask, a second step S200 of preparing an initial substrate, a third step S300 of aligning the mask with the initial substrate, a fourth step S400 of forming a first through-hole and a second through-hole in the initial substrate, and a fifth step S500 of forming a light emitting element layer.

FIGS. 10 to 14 illustrate the steps of the display panel manufacturing method according to an embodiment. Components identical to the components described above with reference to FIGS. 1 to 8 will be assigned with identical reference numerals, and repetitive descriptions will be omitted.

Figure 10:
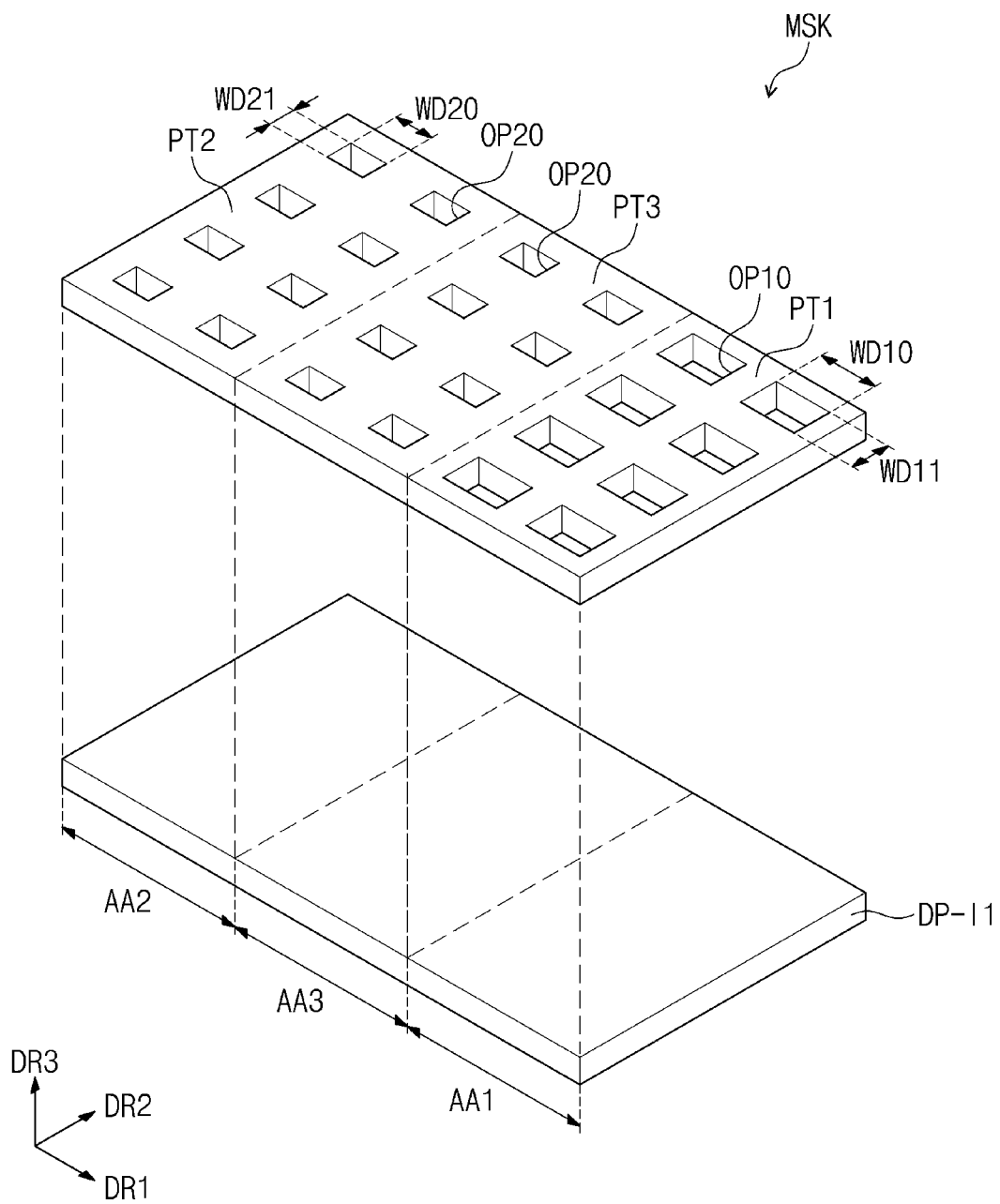
FIGS. 10, 11, 12A, 12B, 12C, 13, and 14 illustrate steps of the display panel manufacturing method according to an embodiment.

Referring to FIGS. 9 and 10 together, the first step S100 of preparing the mask may be a step of preparing a mask MSK in which a first opening OP10 and a second opening OP20 smaller than the first opening OP10 are defined to be spaced apart from each other.

As illustrated in FIG. 10, the mask MSK may be used to perform a photolithography process on an initial substrate DP-I1. The mask MSK may have openings formed therein so as to be spaced apart from each other on the plane. The mask MSK may contain a metallic material. For example, the mask MSK may contain Invar having a relatively small coefficient of thermal expansion. The mask MSK may contain, for example, nickel (Ni), a nickel-cobalt alloy, a nickel-iron alloy, or the like within the spirit and the scope of the disclosure. The mask MSK containing metal as a material may have a sufficient stiffness.

In an embodiment, the mask MSK may include a first portion PT1 in which the first opening OP10 is formed, a second portion PT2 in which the second opening OP20 is formed, and a third portion PT3 that is disposed between the first portion PT1 and the second portion PT2 and in which the second opening OP20 is formed.

First openings OP10 may be provided. The first openings OP10 may penetrate the first portion PT1.

Second openings OP20 may be provided. Each of the second openings OP20 may penetrate the second portion PT2 or the third portion PT3.

In an embodiment, the second openings OP20 may be smaller than the first openings OP10. The cross-sectional shape of the second openings OP20 may be similar to the cross-sectional shape of the first openings OP10. For example, the second openings OP20 and the first openings OP10 may have rectangular shapes having different areas.

In FIG. 10, the first openings OP10 and the second openings OIP20 are illustrated as having a rectangular shape. However, the disclosure is not limited thereto, and the first openings OP10 and the second openings OP20 may have various shapes, such as a polygonal shape, a circular shape, an oval shape, a shape having at least one curved side or a curved side, an irregular shape, and the like, and are not limited to any one embodiment.

In an embodiment, the horizontal lengths WD10 of the first openings OP10 may satisfy a value "a", and the vertical lengths WD11 of the first openings OP10 may satisfy a value "c". "a" and "c" may be positive numbers. The horizontal lengths WD20 of the second openings OP20 may satisfy a value "a-2b", and the vertical lengths WD21 of the second openings OP20 may satisfy a value "c-2d". "b" and "d" may be positive numbers, "a" may be greater than "2b", and "c" may be greater than "2d".

Figure 11:
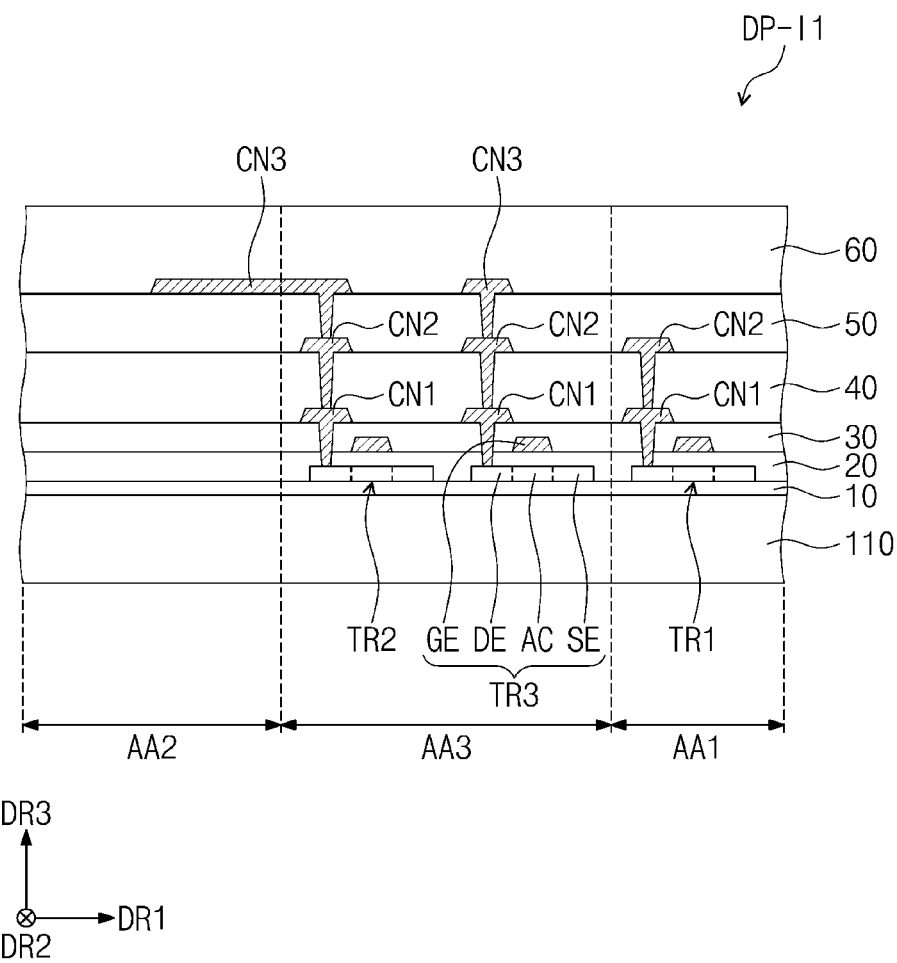

Referring to FIGS. 9, 10, and 11 together, the second step S200 of preparing the initial substrate may be a step of preparing an initial substrate DP-I1 that may include a fourth insulating layer 40 (or, a first intermediate insulating layer), a second connecting electrode CN2 (or, a first conductive pattern) disposed on the fourth insulating layer 40, a fifth insulating layer 50 (or, a second intermediate insulating layer) that covers or overlaps the second connecting electrode CN2, a third connecting electrode CN3 (or, a second conductive pattern) that does not overlap the second connecting electrode CN2 on the plane and that is disposed on the fifth insulating layer 50, and a sixth insulating layer 60 (or, a third intermediate insulating layer) that covers or overlaps the third connecting electrode CN3. As illustrated in FIG. 11, second connecting electrodes CN2 and third connecting electrodes CN3 may be provided, and at least some or a number of the second connecting electrodes CN2 may not overlap the third connecting electrodes CN3 and may be spaced apart from each other on the plane. By way of example, on the plane, the second electrode CN2 disposed in the first area AA1 may be spaced apart from the third connecting electrodes CN3 disposed in at least one of the second area AA2 or the third area AA3.

The initial substrate DP-I1 may include the first area AA1, the second area AA2, and the third area AA3 between the first area AA1 and the second area AA2. The first area AA1, the second area AA2, and the third area AA3 may correspond to the first area AA1, the second area AA2, and the third area AA3 of the above-described display panel 100. The initial substrate DP-I1 may include some or a number of components of the circuit layer 120 and the base layer 110 described above with reference to FIG. 4.

Referring to FIGS. 9, 10, and 11 together, the third step S300 of aligning the mask with the initial substrate may be a step of aligning the mask MSK with the initial substrate DP-I1 such that the first openings OP10 overlap the second connecting electrodes CN2 and the second openings OP20 overlap the third connecting electrodes CN3. In the third step S300, the first portion PT1, the second portion PT2, and the third portion PT3 of the mask MSK may be disposed to overlap the first area AA1, the second area AA2, and the third area AA3 of the initial substrate DP-I1.

Accordingly, the mask MSK may be disposed over the initial substrate DP-I1 such that the first openings OP10 overlap the second connecting electrodes CN2 disposed in the first area AA1 and the second openings OP20 overlap the third connecting electrodes CN3 disposed in the second area AA2 and the third area AA3.

Referring to FIGS. 9, 10, 11, 12A, 12B, and 12C together, the fourth step S400 of forming the first through-hole and the second through-hole in the initial substrate may be a step of forming, in an initial substrate DP-I2 using the mask MSK, first through holes OP1 that correspond to the first openings OP10 and penetrate the fifth and sixth insulating layers 50 and 60 and second through-holes OP2 that correspond to the second openings OP20 and penetrate the sixth insulating layer 60.

By way of example, the fourth step S400 may be a step of forming the first through-holes OP1 in the first area AA1 of the initial substrate DP-I2 and forming the second through-holes OP2 in the second area AA2 and the third area AA3 of the initial substrate DP-I2. As described above with reference to FIG. 7, first surfaces SF1 of the second connecting electrodes CN2 may be exposed to the outside by the first through-holes OP1. As described above with reference to FIG. 8, second surfaces SF2 of the third connecting electrodes CN3 may be exposed to the outside by the second through-holes OP2.

Figure 12A:
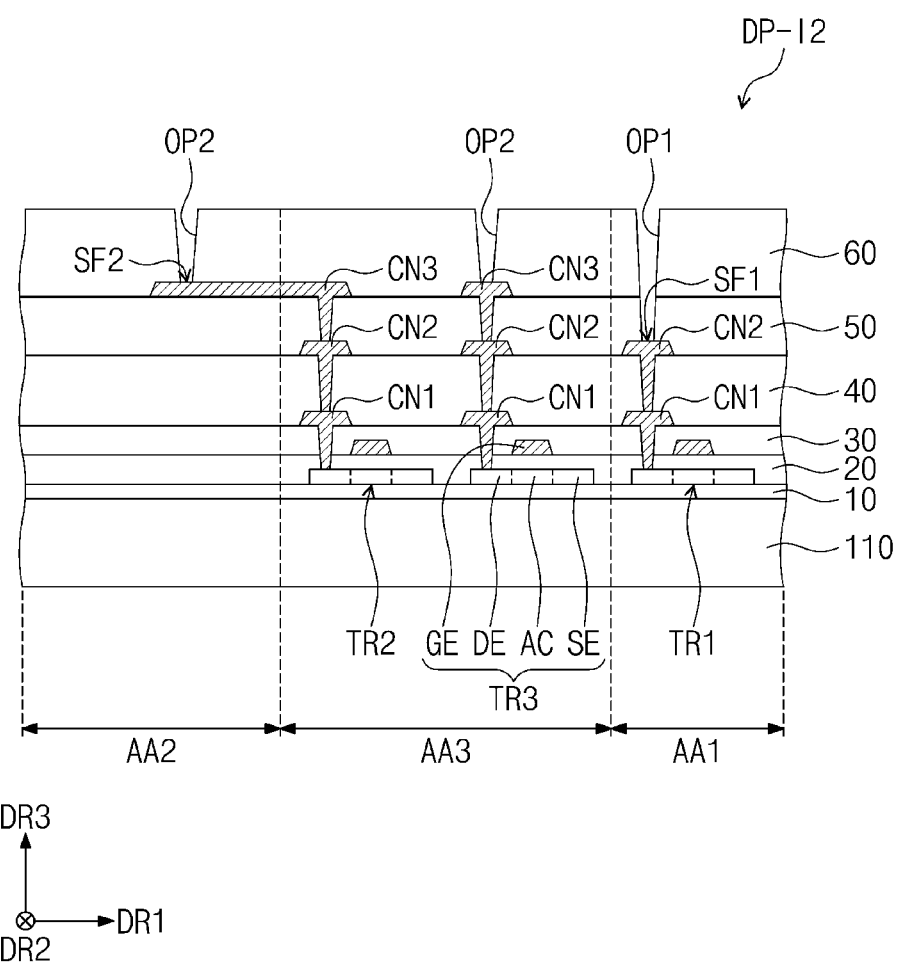

The components of the circuit layer 120 described above with reference to FIGS. 4 and 5 may be identically formed in the initial substrate DP-I2 of FIG. 12A through a method such as coating, deposition, or the like within the spirit and the scope of the disclosure.

Figure 12B:
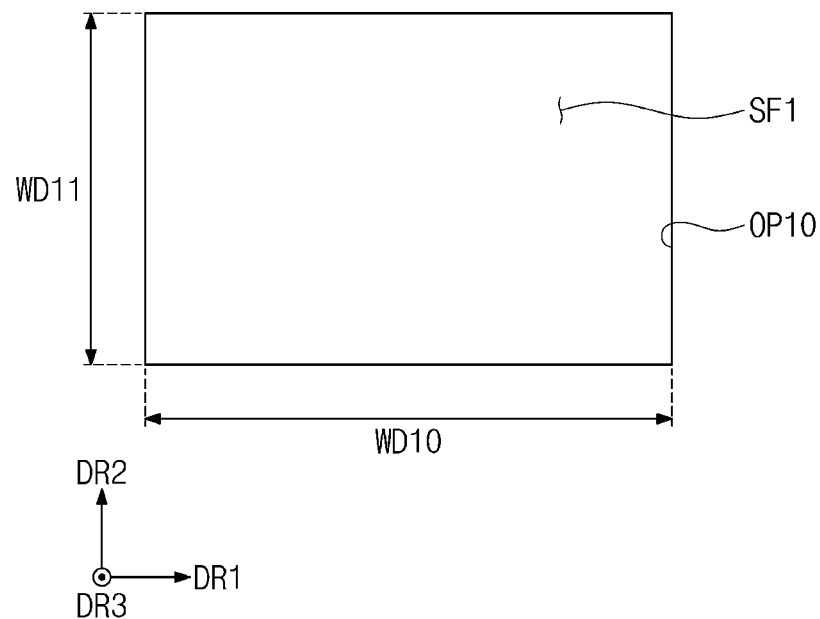
Figure 12C:
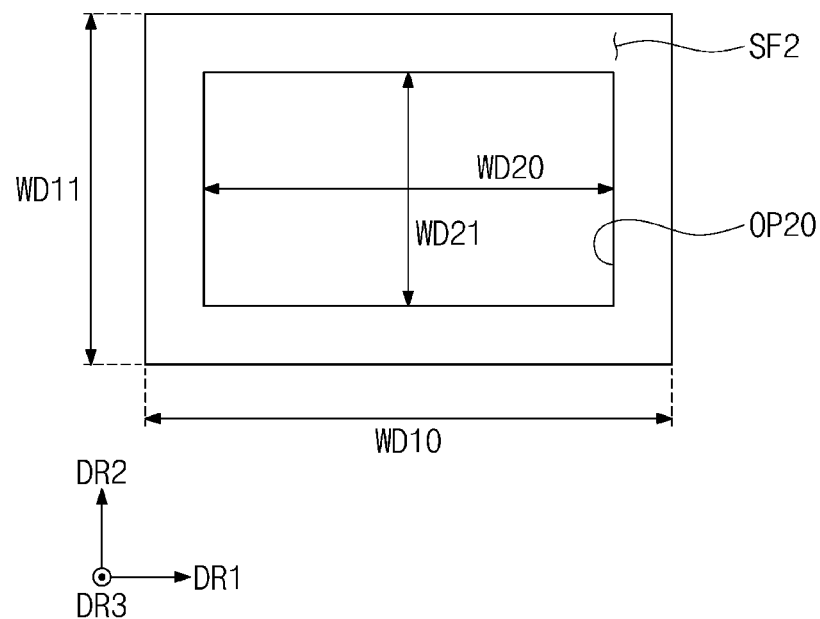
Figure 13:
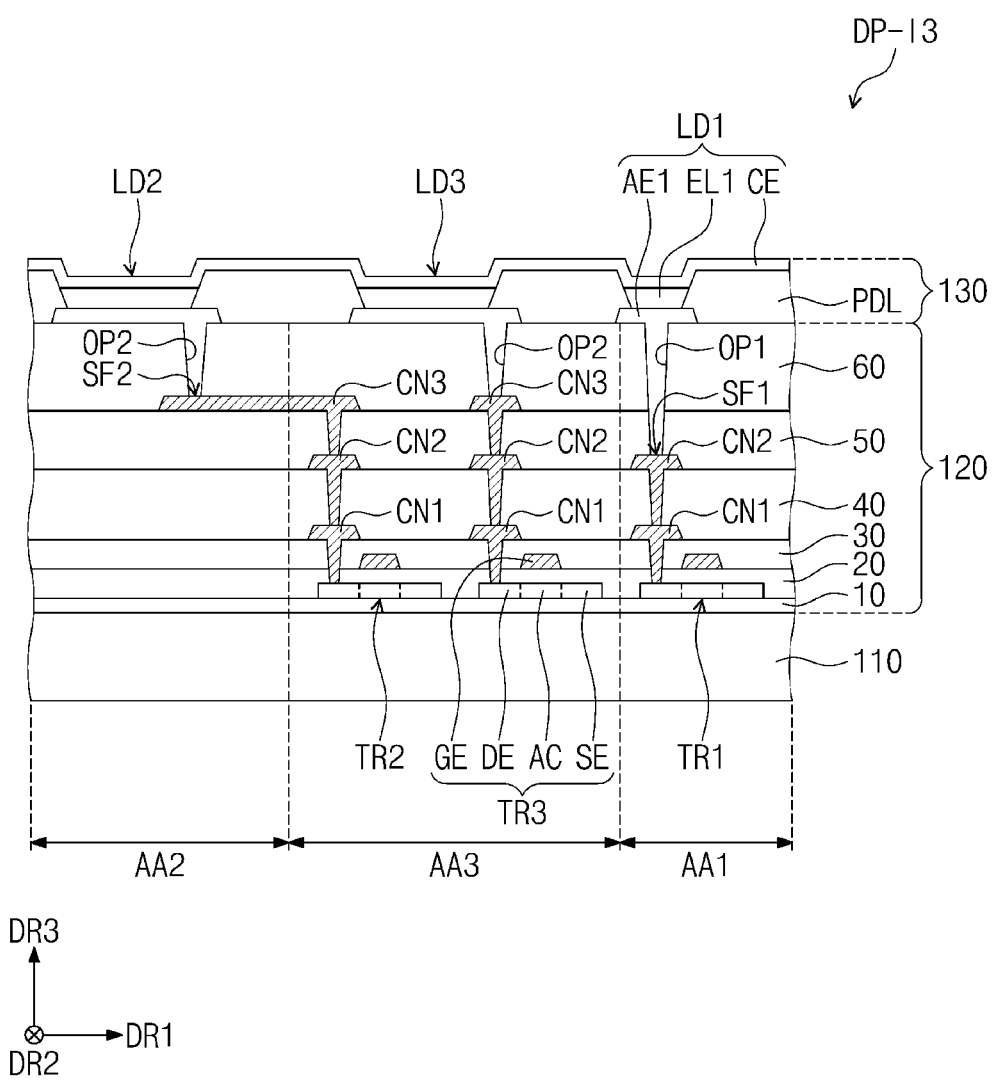

FIG. 12B illustrates a comparison between the size of the first opening OP10 of the mask MSK and the size of the first surface SF1 that is the upper surface of the second connecting electrode CN2 exposed by the first through-hole OP1. FIG. 12C illustrates a comparison between the size of the second opening OP20 of the mask MSK and the size of the second surface SF2 that is the upper surface of the third connecting electrode CN3 exposed by the second through-hole OP2.

Referring to FIGS. 12B and 12C together, the cross-section of the first opening OP10, the first surface SF1, and the second surface SF2 may have substantially the same shape and size. Although the cross-section of the first opening OP10, the first surface SF1, and the second surface SF2 are illustrated as having a rectangular shape, the disclosure is not limited thereto, and the cross-section of the first opening OP10, the first surface SF1, and the second surface SF2 may be formed in one of various shapes, such as a polygonal shape, a circular shape, an oval shape, a shape having at least one curved side or a curved side, an irregular shape, and the like within the spirit and the scope of the disclosure.

For example, the cross-section of the first opening OP10 may have a rectangular shape, the horizontal length WD10 may satisfy the value "a", and the vertical length WD11 may satisfy the value "c". The first surface SF1 may have a rectangular shape, the horizontal length WD10 may satisfy the value "a", and the vertical length WD11 may satisfy the value "c". The second surface SF2 may have a rectangular shape, the horizontal length WD10 may satisfy the value "a", and the vertical length WD11 may satisfy the value "c".

In contrast, the shape of the cross-section of the second opening OP20 may be similar to the shapes of the cross-section of the first opening OP10, the first surface SF1, and the second surface SF2. For example, the cross-section of the second opening OP20 may have a smaller size than the cross-section of the first opening OP10, the first surface SF1, and the second surface SF2. By way of example, the horizontal length WD20 of the second openings OP20 may satisfy the value "a-2b", and the vertical length WD21 of the second openings OP20 may satisfy the value "c-2d".

In case that the first opening OP10 and the second opening OP20 in the mask MSK have a same size, the second through-hole OP2 may have a larger size than the first through-hole OP1 due to the difference in thickness between the insulating layers that the first through-hole OP1 and the second through-hole OP2 penetrate. For example, the horizontal length of the second through-hole OP2 may be greater than the horizontal length of the first through-hole OP1 by "2b", and the vertical length of the second through-hole OP2 may be greater than the vertical length of the first through-hole OP1 by "2d".

In the display panel manufacturing method of the disclosure, the second through-hole OP2 may be formed to have a same size as the first through-hole OP1, by adjusting the size of the second opening OP20 to a smaller size than the first opening OP10. Accordingly, the area of the second surface SF2, which is the upper surface of the third connecting electrode CN3 exposed by the second through-hole OP2, may be substantially the same as the area of the first surface SF1, which is the upper surface of the second connecting electrode CN2 exposed by the first through-hole OP1.

Because the first surface SF1 and the second surface SF2 have substantially the same area in the display panel of the disclosure, the size of the third connecting electrode CN3 may be minimized, and the space occupied by the third connecting electrode CN3 in the second area AA2 and the third area AA3 of the circuit layer 120 may be minimized. Accordingly, the lengths of lines disposed in the second area AA2 and the third area AA3 may be increased, and the areas of the second area AA2 and the third area AA3 may be further expanded. The area of the display area DAA including the second area AA2 and the third area AA3 may also be further expanded.

Referring to FIGS. 9, 10, 11, 12A, 12B, 12C, and 13 together, the fifth step S500 of forming the light emitting element layer may be a step of forming an initial substrate DP-I3 including a light emitting element layer 130. For example, the light emitting element layer 130 may be formed on the initial substrate DP-I2 of FIG. 12C by a method such as coating, deposition, or the like within the spirit and the scope of the disclosure. As described above with reference to FIG. 4, the light emitting element layer 130 may include a first light emitting element LD1, a second light emitting element LD2, a third light emitting element LD3, and a pixel defining film PDL.

Figure 14:
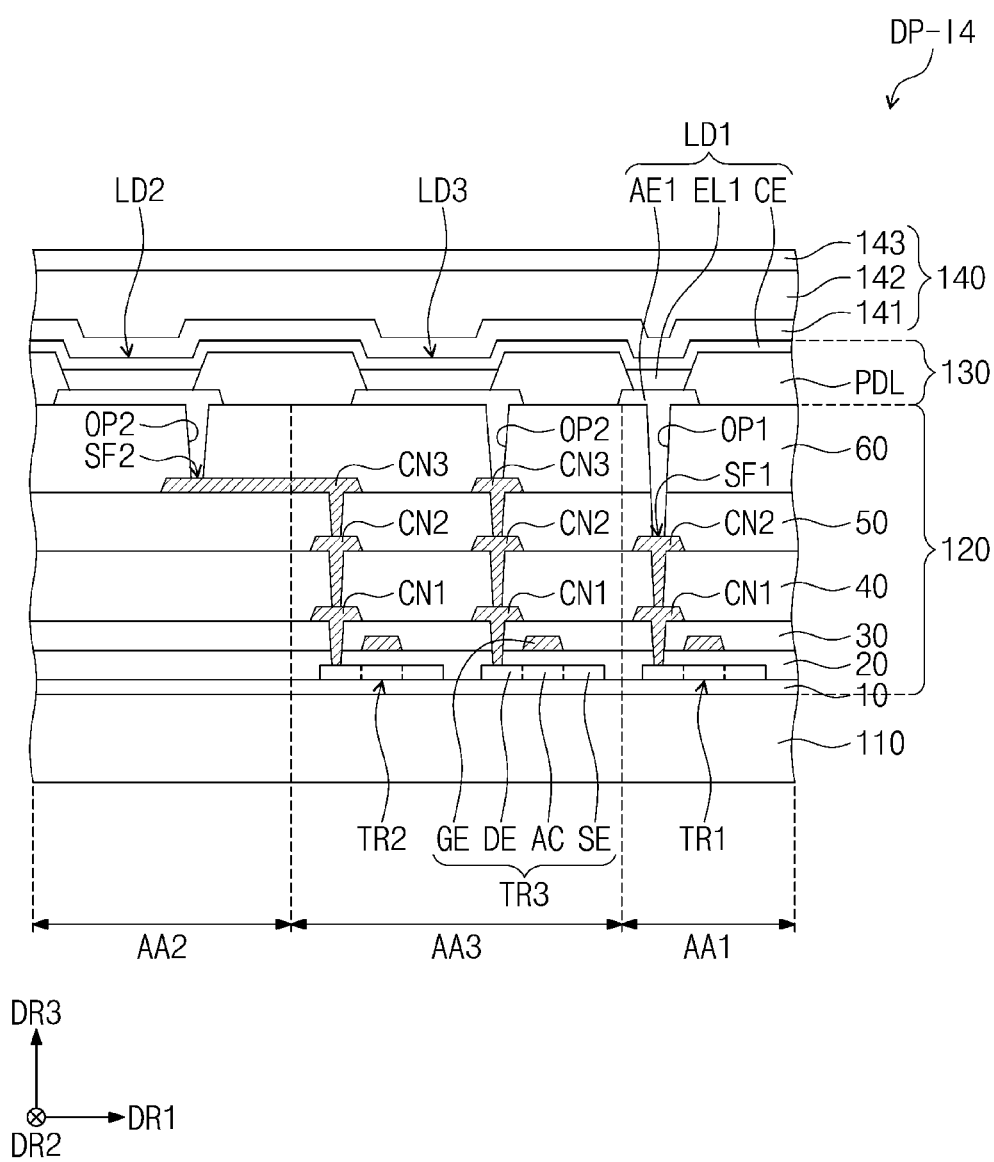

Referring to FIG. 14, a step of forming an initial substrate DP-I4 including an encapsulation layer 140 may be performed after the fifth step S500. The contents described with reference to FIG. 4 may be identically applied to the encapsulation layer 140. The initial substrate DP-I4 including the encapsulation layer 140 may be the same as the above-described display panel 100. Although some or a number of components of the display panel 100 are omitted in FIG. 14, the initial substrate DP-I4 should be understood as including all of the components of the display panel 100 described above.

In the display panel manufacturing method of the disclosure, the first through-hole OP1 formed through the fifth insulating layer 50 and the sixth insulating layer 60 may be formed to have substantially the same size as the second through-hole OP2 formed through the sixth insulating layer 60, by forming the second opening OP20 in the mask MSK to a smaller size than the first opening OP10.

In the display panel of the disclosure, the upper surface of the third connecting electrode CN3 exposed by the second through-hole OP2 may have substantially the same size and shape as the upper surface of the second connecting electrode CN2 exposed by the first through-hole OP1. Accordingly, the size of the third connecting electrode CN3 may be minimized, and the number of lines or electrodes disposed in the second area AA2 and the third area AA3 or the lengths of the lines may be increased. The areas of the second area AA2 and the third area AA3 may be further expanded, and the area of the display area DAA may be further expanded.

According to the disclosure, a display panel in which a display area is expanded to an area where a driver circuit is disposed, and an electronic device including the display panel may be provided.

According to the disclosure, a display panel having improved visibility and an electronic device including the same may be provided.

While the disclosure has been described with reference to embodiments thereof, it will be apparent to those of ordinary skill in the art that various changes and modifications may be made thereto without departing from the spirit and scope of the disclosure and as set forth in the following claims.

What is claimed is:

1. A display panel comprising:
   a base layer including:
      a first area;
      a second area; and
      a third area, the third area being disposed between the first area and the second area;
   a circuit layer including:
      a first intermediate insulating layer disposed on the base layer;
      first conductive patterns disposed on the first intermediate insulating layer;
      a second intermediate insulating layer covering the first conductive patterns;
      second conductive patterns disposed on the second intermediate insulating layer; and
      a third intermediate insulating layer covering the second conductive patterns; and
   a light emitting element layer disposed on the circuit layer, the light emitting element layer including a first light emitting element and a second light emitting element disposed in
   the first area and the second area, respectively, of the base layer, wherein the first light emitting element is electrically connected to one of the first conductive patterns through a first through-hole formed through the second intermediate insulating layer and the third intermediate insulating layer,
   the second light emitting element is electrically connected to one of the second conductive patterns through a second through-hole formed through the third intermediate insulating layer,
   a smallest width of the first through-hole and a smallest width of the second through-hole are substantially equal to each other on a cross-section, and
   the first conductive patterns are spaced apart and disposed in the first area and the third area of the base layer.

2. The display panel of claim 1, wherein the second conductive patterns are spaced apart and disposed in the second area and the third area of the base layer.

3. The display panel of claim 1, wherein the circuit layer includes a first pixel transistor disposed in the first area and a second pixel transistor disposed in the third area of the base layer.

4. The display panel of claim 3, wherein the circuit layer includes a drive transistor disposed in the second area of the base layer.

5. The display panel of claim 3, wherein one of the first conductive patterns electrically connects the first light emitting element to the first pixel transistor.

6. The display panel of claim 3, wherein one of the second conductive patterns electrically connects the second light emitting element to the second pixel transistor.

7. The display panel of claim 6, wherein the first pixel transistor and the second pixel transistor are disposed below the first intermediate insulating layer.

8. The display panel of claim 1, wherein the second conductive patterns include a transparent conductive oxide.

9. The display panel of claim 1, wherein
   the light emitting element layer includes a third light emitting element disposed in the third area of the base layer, and the circuit layer includes a third pixel transistor electrically connected to the third light emitting element and disposed in the third area of the base layer.

10. The display panel of claim 9, wherein one of the second conductive patterns electrically connects the third light emitting element to the third pixel transistor.

11. A display panel comprising:
a base layer including a first area and a second area spaced apart from each other on a plane;
a circuit layer including:
insulating layers including a first through-hole and a second through-hole;
a first conductive pattern disposed between two insulating layers among the insulating layers and disposed in the first area of the base layer; and
a second conductive pattern disposed between two insulating layers among the insulating layers and disposed in the second area of the base layer, the second conductive pattern overlapping the first conductive pattern in a plan view; and
a light emitting element layer including a first light emitting element and a second light emitting element disposed in the first area and the second area, respectively, of the base layer, wherein
the first through-hole exposes a first surface of an upper surface of the first conductive pattern,
the second through-hole exposes a second surface of an upper surface of the second conductive pattern,
the first light emitting element contacts the first surface,
the second light emitting element contacts the second surface,
the second surface and the first surface have a same shape, and
the circuit layer includes a first pixel transistor disposed in the first area of the base layer and a drive transistor disposed in the second area of the base layer.

12. The display panel of claim 11, wherein the circuit layer further includes a second pixel transistor disposed in the second area of the base layer.

13. The display panel of claim 12, wherein
the first conductive pattern electrically connects the first light emitting element to the first pixel transistor, and
the second conductive pattern electrically connects the second light emitting element to the second pixel transistor.

14. A method for manufacturing a display panel, the method comprising:
preparing a mask including a first opening and a second opening smaller than the first opening, the first opening being spaced apart from the second opening;
preparing an initial substrate including:
pixel transistors disposed in a first area;
a driver circuit including:
a drive transistor disposed in a second area spaced apart from the pixel transistors;
a first intermediate insulating layer disposed on the driver circuit and the pixel transistors;
a first conductive pattern overlapping the first area and disposed on the first intermediate insulating layer in a plan view;
a second intermediate insulating layer covering the first conductive pattern;
a second conductive pattern overlapping the second area and disposed on the second intermediate insulating layer in a plan view; and
a third intermediate insulating layer covering the second conductive pattern;
aligning the mask with the initial substrate such that the first opening overlaps the first conductive pattern and the second opening overlaps the second conductive pattern in a plan view; and
forming a first through-hole and a second through-hole in the initial substrate using the mask, wherein
the first through-hole corresponds to the first opening and penetrates the second intermediate insulating layer and the third intermediate insulating layer,
the second through-hole corresponds to the second opening and penetrates the third intermediate insulating layer,
the first through-hole exposes a first surface of a portion of an upper surface of the first conductive pattern,
the second through-hole exposes a second surface of a portion of an upper surface of the second conductive pattern, and
the second surface and the first surface have substantially a same shape in a plan view.

15. The method of claim 14, wherein the first opening, the first surface, and the second surface have substantially a same shape in a plan view.

16. The method of claim 14, wherein
the mask includes:
a first portion including the first opening; and
a second portion including the second opening, and
in the aligning of the mask with the initial substrate, the first portion overlaps the first area, and the second portion overlaps the second area in a plan view.

17. The method of claim 14, wherein
the initial substrate includes a third area disposed between the first area and the second area, and
the third area includes pixel transistors.

18. The method of claim 17, further comprising:
forming a light emitting element layer on the third intermediate insulating layer after the forming of the first through-hole and the second through-hole in the initial substrate using the mask,
wherein a first light emitting element disposed in the first area and electrically connected to the first conductive pattern through the first through-hole and a second light emitting element disposed in the second area and electrically connected to the second conductive pattern through the second through-hole are formed in the forming of the light emitting element layer on the third intermediate insulating layer.

19. The method of claim 18, wherein
the first light emitting element is electrically connected to one of the pixel transistors disposed in the first area through the first conductive pattern, and
the second light emitting element is electrically connected to one of the pixel transistors disposed in the third area through the second conductive pattern.

* * * * *